(12) United States Patent
Patra

(10) Patent No.: US 10,802,403 B2
(45) Date of Patent: Oct. 13, 2020

(54) METHOD FOR THE MICROLITHOGRAPHIC PRODUCTION OF MICROSTRUCTURED COMPONENTS

(71) Applicant: Carl Zeiss SMT GmbH, Oberkochen (DE)

(72) Inventor: Michael Patra, Oberkochen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 0 days.

(21) Appl. No.: 16/385,807

(22) Filed: Apr. 16, 2019

(65) Prior Publication Data

US 2019/0243248 A1 Aug. 8, 2019

Related U.S. Application Data

(63) Continuation of application No. PCT/EP2017/075490, filed on Oct. 6, 2017.

(30) Foreign Application Priority Data

Oct. 28, 2016 (DE) .......................... 10 2016 221 261

(51) Int. Cl.
*G03F 7/20* (2006.01)
*G03F 7/38* (2006.01)

(52) U.S. Cl.
CPC .............. *G03F 7/2022* (2013.01); *G03F 7/38* (2013.01); *G03F 7/7055* (2013.01);
(Continued)

(58) Field of Classification Search
CPC ...... G03F 7/2022; G03F 7/38; G03F 7/70466; G03F 7/7055; G03F 7/70616; G03F 7/70666
See application file for complete search history.

(56) References Cited

U.S. PATENT DOCUMENTS 5,576,829 A * 11/1996 Shiraishi ................ G01N 21/88
356/432
10,096,528 B2 * 10/2018 deVilliers ............... H01L 22/20
(Continued)

OTHER PUBLICATIONS

Translation of International Search Report for corresponding PCT Appl No. PCT/EP2017/075490, dated Jan. 19, 2018.
(Continued)

*Primary Examiner* — Deoram Persaud
(74) *Attorney, Agent, or Firm* — Fish & Richardson P.C.

(57) ABSTRACT

A method for the microlithographic production of microstructured components, includes: providing a wafer, to which a photoresist is applied at least partly; providing a mask having structures to be imaged; providing a projection exposure apparatus having an illumination unit and a projection lens; exposing the photoresist by projecting at least one part of the mask onto a region of the photoresist with the aid of the projection exposure apparatus; and ascertaining a deviation between a structure property of the structures produced on the exposed wafer from a predefined desired structure property. Ascertaining includes: determining at least one property of a light field used for exposing the photoresist applied to the wafer. The method further includes aftertreating the wafer on the basis of the ascertained deviation, and chemically developing the after treated wafer.

20 Claims, 20 Drawing Sheets

(52) U.S. Cl.
CPC ...... *G03F 7/70466* (2013.01); *G03F 7/70616* (2013.01); *G03F 7/70666* (2013.01)

(56) References Cited

U.S. PATENT DOCUMENTS

| | | | |
|---|---|---|---|
| 10,429,745 B2* | 10/2019 | Carcasi | G03F 7/2022 |
| 10,551,743 B2* | 2/2020 | Carcasi | G03F 7/16 |
| 2008/0079934 A1 | 4/2008 | Scheer | |
| 2008/0291421 A1* | 11/2008 | Miyaharu | G03F 7/70666 355/68 |
| 2010/0273099 A1 | 10/2010 | Fonseca et al. | |
| 2011/0032499 A1* | 2/2011 | Kawashima | G03B 27/42 355/53 |
| 2011/0090329 A1* | 4/2011 | Poortinga | G03F 1/84 348/79 |
| 2014/0320627 A1* | 10/2014 | Miyamoto | G01N 23/00 348/80 |
| 2015/0212421 A1* | 7/2015 | deVilliers | G03F 7/70425 430/325 |
| 2015/0241793 A1 | 8/2015 | Carcasi et al. | |
| 2016/0048080 A1 | 2/2016 | deVilliers | |
| 2019/0107776 A1* | 4/2019 | Thaler | G01N 21/956 |
| 2019/0271922 A1* | 9/2019 | Takakuwa | G03F 7/70616 |
| 2019/0302622 A1* | 10/2019 | Matsuyama | G03F 7/70491 |

OTHER PUBLICATIONS

Seiiji Nagahara et al., "Challenge toward breakage of RLS trade-off for EUV lithography by Photosensitized Chemically Amplified Resist (PSCAR) with flood exposure", Proceedings Optical Diagnostics of Living Cells II, SPIE, US, vol. 9776, Mar. 18, 2016.

Seiichi Tagawa et al., "Super High Sensitivity Enhancement by Photo-Sensitized Chemically Amplified Resist (PS-CAR) Process", *J. of Photopolym. Sci. and Technol.*, vol. 26, No. 6, Jan. 1, 2013.

C.M. Berger, J.D. Byers, and C.L. Henderson, J. Electrochem. Soc. 151, G119 2004.

C.M. Berger and C.L.Henderson, J. Vac. Sci. Technol. B, 22, 1163 2004.

C.-T. Lee et al., Electrochemical and Solid-State Letters, 10 (9) H273-H277 (2007).

Chris Mack, "Fundamental Principles of Optical Lithography: The Science of Microfabrication", pp. 223-235; 2007 John Wiley & Sons, Ltd.

GPTO office action, with translation thereof, for corresponding DE 10 2016 221 261.3, dated Jun. 29, 2017.

IPRP for PCT/EP2017/075490 dated Apr. 30, 2019.

\* cited by examiner

METHOD FOR THE MICROLITHOGRAPHIC PRODUCTION OF MICROSTRUCTURED COMPONENTS

CROSS-REFERENCE TO RELATED APPLICATIONS

The present application is a continuation of, and claims benefit under 35 USC 120 to, international application PCT/EP2017/075490, filed Oct. 6, 2017, which claims benefit under 35 USC 119 of German Application No. 10 2016 203 591.6, filed Oct. 28, 2016. The entire disclosure of these applications are incorporated by reference herein.

FIELD

The present disclosure relates to a method for the microlithographic production of microstructured components, and to a device for aftertreating a microlithographically exposed wafer.

BACKGROUND

Microlithography is used to produce microstructured components, such as integrated circuits or LCDs, for example. The microlithography process is carried out in a so-called projection exposure apparatus having an illumination unit and a projection lens. In this case, the image of a mask (=reticle) illuminated via the illumination unit is projected via the projection lens onto a substrate (e.g. a silicon wafer) coated with a light-sensitive layer (photoresist) and arranged in the image plane of the projection lens, in order to transfer the mask structure to the light-sensitive coating of the substrate.

For the highly accurate production of microstructured components or circuits, a variety of approaches are known for controlling the light field generated microlithographically for the purpose of structuring on the wafer with the highest possible accuracy, which in particular also includes stabilizing the illumination unit as well as possible.

This control and stabilization constitute a demanding challenge in many regards, wherein in particular stringent desired properties are made for example of the configuration of optical components used for setting specific illumination settings (e.g. a diffractive optical element or a mirror arrangement including a multiplicity of mutually independently adjustable mirror elements). Further measures for the highly accurate control of the light field include the setting of a highly accurate uniformity and also dose stability of the electromagnetic radiation and also the provision of corresponding measuring units.

SUMMARY

The present disclosure seeks to provide a method for the microlithographic production of microstructured components and also a device for aftertreating a microlithographically exposed wafer which make possible the highly accurate fabrication of microstructured components or circuits with lower complexity in terms of equipment.

A method according to the disclosure for the microlithographic production of microstructured components includes the following steps:

providing a wafer, to which a photoresist is applied at least partly;
providing a mask having structures to be imaged;
providing a projection exposure apparatus having an illumination unit and a projection lens;
exposing the photoresist by projecting at least one part of the mask onto a region of the photoresist with the aid of the projection exposure apparatus;
ascertaining a deviation of at least one structure property of the structures produced on the exposed wafer from a predefined desired structure property, wherein this ascertaining is carried out by determining at least one property of a light field used for exposing the photoresist applied to the wafer;
aftertreating the wafer on the basis of the ascertained deviation; and
chemically developing the aftertreated wafer.

The disclosure is based on the concept, in particular, of reducing the complexity that is to be implemented in the illumination unit and/or the projection lens of a microlithographic projection exposure apparatus with regard to the control and stabilization of the light field generated on the wafer by accepting from the outset deviations of the light field and/or of the structures produced on the wafer as a result of this exposure, the deviations possibly arising in the exposure process with regard to the light field and also the structure properties produced on the wafer as a result of the light field. In this case, the disclosure further includes the concept of firstly ascertaining these accepted deviations and performing a suitable aftertreatment of the exposed wafer or photoresist on the basis of this ascertainment.

Ascertaining a deviation of at least one structure property of the structures produced on the exposed wafer from a predefined desired structure property is carried out according to the disclosure by determining at least one property of the light field which exposes the photoresist applied to the wafer. In this case, the disclosure differs in particular from conventional approaches which involve directly determining properties of the wafer or carrying out metrology on the wafer treated in the lithography process.

According to the disclosure, ascertaining the deviation can be carried out by measurement, by consulting a design model or by consulting available data regarding the projection exposure apparatus. In particular, according to the disclosure, it is possible to carry out metrology on the (light) field used for exposing the wafer (e.g. in the projection exposure apparatus itself) during the lithography process itself, or it is possible to use data relating to the projection exposure apparatus in the form of measurement data already obtained from metrology in the projection exposure apparatus beforehand before carrying out the lithography process and/or in the form of design data relating to the projection exposure apparatus and/or models (e.g. for the model-based description of heating effects during the operation of the projection exposure apparatus, so-called "lens heating"). It is also possible to take into account here in each case properties of the wafer and/or of the photoresist which the latter exhibit(s) before the actual exposure, ambient parameter such as e.g. temperature or air pressure during the lithography process and also properties of the light source used.

The variables that are measured, calculated or determined in some other way can relate directly to a property of the light field. Intensity distributions in field and/or pupil planes are exemplary variables of this type, as are four-dimensional intensity distributions as a function of location and direction, just like higher-dimensional intensity distributions as a function of location, direction, wavelength and/or polarization state. The variables that are measured, calculated or determined in some other way can also relate to how the light field is altered by a subsystem of the projection exposure apparatus. Pupil-dependent apodization profiles or wavefront profiles (that is to say deviations of the area of constant phase of the light field from a reference sphere) of the projection lens are exemplary variables of this type.

In this case, the disclosure proceeds from the consideration that in the course of the microlithographic production process, during the wafer exposure as a result of photons impinging on the photoresist, acids and/or free hydrogen ions are indeed produced, which in turn ultimately bring about the change in the solubility of the photoresist, the change being crucial for the structuring, by way of cutting apart polymers contained in the photoresist, but the cutting apart of the polymers takes place only in a separate process step subsequent to the exposure, namely a subsequent "baking process" (="Post-Exposure Bake", typically at a temperature of 80° C.-90° C.). The disclosure makes use of this circumstance by virtue of the fact that the time period remaining between the actual wafer exposure and the subsequent baking process is also used for an aftertreatment of the wafer to the effect that possible undesired deviations of specific structure properties of the wafer, the deviations being produced as a result of the actual wafer exposure, are at least partly compensated for in the course of the aftertreatment.

As explained in even greater detail below, the aftertreatment can include for example the provision of additional acids and/or free hydrogen ions or else a post-exposure with a wavelength deviating from the actual operating wavelength of the projection exposure apparatus.

As a result, the complexity to be implemented during the actual exposure process on the part of the illumination unit and also the projection lens with regard to the control and also the stabilization of the light field generated on the wafer can thus be significantly reduced since "errors" that occur need not be avoided from the outset, but rather can be merely ascertained (e.g. measured or estimated) and then—as described above—corrected subsequently.

An advantage of the method according to the disclosure consists here in the fact that the settings to be effected during the aftertreatment according to the disclosure for the correction of structure properties of the wafer can typically be implemented on a significantly longer length scale than the structure sizes that are ultimately to be produced on the wafer. This is because while the structure sizes are typically of the order of magnitude of (10-20) nm, the length scale of typical deviations of structure properties that are introduced by the illumination unit and/or the projection lens is of the order of magnitude of approximately 1 mm with the consequence that the devices used for measuring and/or influencing the errors produced can also be realized significantly more simply and more cost-effectively.

In accordance with one embodiment, the at least one structure property includes a structure size of the structures produced on the exposed after.

In accordance with one embodiment, aftertreating the wafer includes altering a concentration of free hydrogen ions present in the photoresist after the exposing. The altering of the concentration of free hydrogen ions can include in particular applying an acid or an acid scavenger to the photoresist. Furthermore, altering the concentration of free hydrogen ions also includes a post-exposure of the photoresist with light having a wavelength deviating from an operating wavelength of the projection exposure apparatus.

In accordance with one embodiment, the post-exposure of the photoresist is carried out without the use of a mask.

In accordance with one embodiment, aftertreating the wafer is carried out with a spatial resolution that is coarser than ten times the average structure size on the wafer.

In accordance with one embodiment, a temperature set during the process of chemically developing the aftertreated wafer is modified depending on the ascertained deviation.

In accordance with one embodiment, ascertaining a deviation of at least one structure property includes a location-dependent measurement of the intensity distribution generated during illumination of the mask by the illumination unit, a location-dependent measurement of transmission properties of the projection lens, a pupil-dependent measurement of transmission properties of the projection lens, a polarization-dependent measurement of transmission properties of the projection lens, a measurement of the properties of the light source and/or the measurement of the illumination of at least one pupil plane in the projection exposure apparatus.

In accordance with one embodiment, ascertaining a deviation of at least one structure property includes a calculation or modeling of the intensity distribution generated by the illumination unit at the location of the mask, of location-dependent transmission properties of the projection lens, of pupil-dependent transmission properties of the projection lens, of polarization-dependent transmission properties of the projection lens, of a wavefront of the projection lens and/or of the illumination of at least one pupil plane in the projection exposure apparatus.

In accordance with one embodiment, the at least one structure property includes a structure position of the structures produced on the exposed wafer.

In accordance with one embodiment, aftertreating the wafer includes carrying out an etching process.

In accordance with one embodiment, aftertreating the wafer includes heating the photoresist and moving the structures produced on the exposed wafer by local movement of the photoresist.

In this case, it is possible to take into account e.g. a scenario in which the structures produced on the exposed wafer are already correct, in principle, but are still situated at an incorrect position. According to the disclosure, then, in particular a force tangential to the wafer surface can be exerted on the photoresist, wherein flowing of the photoresist can be assisted e.g. by local heating (i.e. heating implemented with the setting of a suitable temperature profile and/or temperature gradient) or by local alteration of the mobility of the photoresist. It is possible, moreover, to achieve a preferred direction via gradients, e.g. of the temperature, which are produced according to the disclosure, even though no explicit external force tangential to the wafer surface is introduced.

The disclosure further relates to a device for aftertreating a microlithographically exposed wafer, wherein a photoresist is applied at least partly to the wafer, wherein the device is configured to change a concentration of a substance that alters the solubility of the photoresist during the development/baking, the concentration existing in the photoresist during a subsequent baking process. The substance can be in particular an acid that is used to cut through polymer chains, wherein the acid concentration determines the polymer cutting-up rate. In this case, according to the disclosure (in contrast to further thermodynamic parameters relevant to the polymer cutting-up rate, such as e.g. temperature) the concentration can be influenced locally with a suitable spatial resolution.

For this purpose, the device can include in particular a unit for the location-dependent exposure of the wafer or for the location-dependent chemical treatment of the wafer. Via the device, substances which produce, liberate or eliminate acids can thus be activated in a light-based manner by exposure with a location-dependent intensity or can be introduced in a location-dependent manner e.g. by spraying or applying.

In accordance with one embodiment, the change described above is carried out with a spatial wavelength in the range of 50 μm to 5 mm. This expresses the fact that the length scale on which the correction of structure properties according to the disclosure has to be implemented is significantly larger than the structuring (in the nm range) taking place during the actual lithography process on the wafer or resist.

In accordance with one embodiment, aftertreating the wafer includes altering a concentration of free hydrogen ions present in the photoresist after the exposing.

In accordance with one embodiment, aftertreating the wafer includes carrying out an etching process.

In accordance with one embodiment, aftertreating the wafer includes heating the photoresist and moving the structures produced on the exposed wafer by local movement of the photoresist.

Further configurations of the disclosure can be gathered from the description and the dependent claims.

The disclosure is explained in greater detail below on the basis of exemplary embodiments illustrated in the accompanying figures.

DETAILED DESCRIPTION OF PREFERRED EMBODIMENTS

What the embodiments described below with reference to the schematic illustrations in FIG. 1 to FIG. 18 have in common is that with regard to at least one structure property of the structures produced on a microlithographically exposed wafer, deviations from the respective desired value firstly are ascertained in a suitable manner and subsequently—in the course of an aftertreatment of the wafer or photoresist—are at least partly corrected.

In this case, according to the disclosure, in the respective procedure both with regard to ascertaining the deviations and with regard to correcting the ascertained deviations, a distinction is made with regard to the type of the structure properties, namely between (a) structure size and (b) structure position.

In this case, the "structure size" is understood to mean the spatial extent or extension of the respective structures produced on the wafer, wherein the associated deviation from the desired value is also referred to as "CD" error (CD="Critical Dimension"). "Structure position" is understood to mean the spatial position or location of the structures produced on the wafer, wherein the corresponding deviation from the desired structure position is also referred to as "Overlay error".

Hereinafter, firstly a description is given of possible embodiments of the disclosure for altering the structure size with reference to FIG. 1 to FIG. 4 and FIG. 18, whereas embodiments for altering the structure position are described with reference to FIG. 5 to FIG. 7.

Furthermore, a description is given of embodiments for determining the structure size with reference to FIG. 8 to FIG. 14, whereas embodiments for determining the structure position are described with reference to FIG. 15 to FIG. 17.

Figure 1:
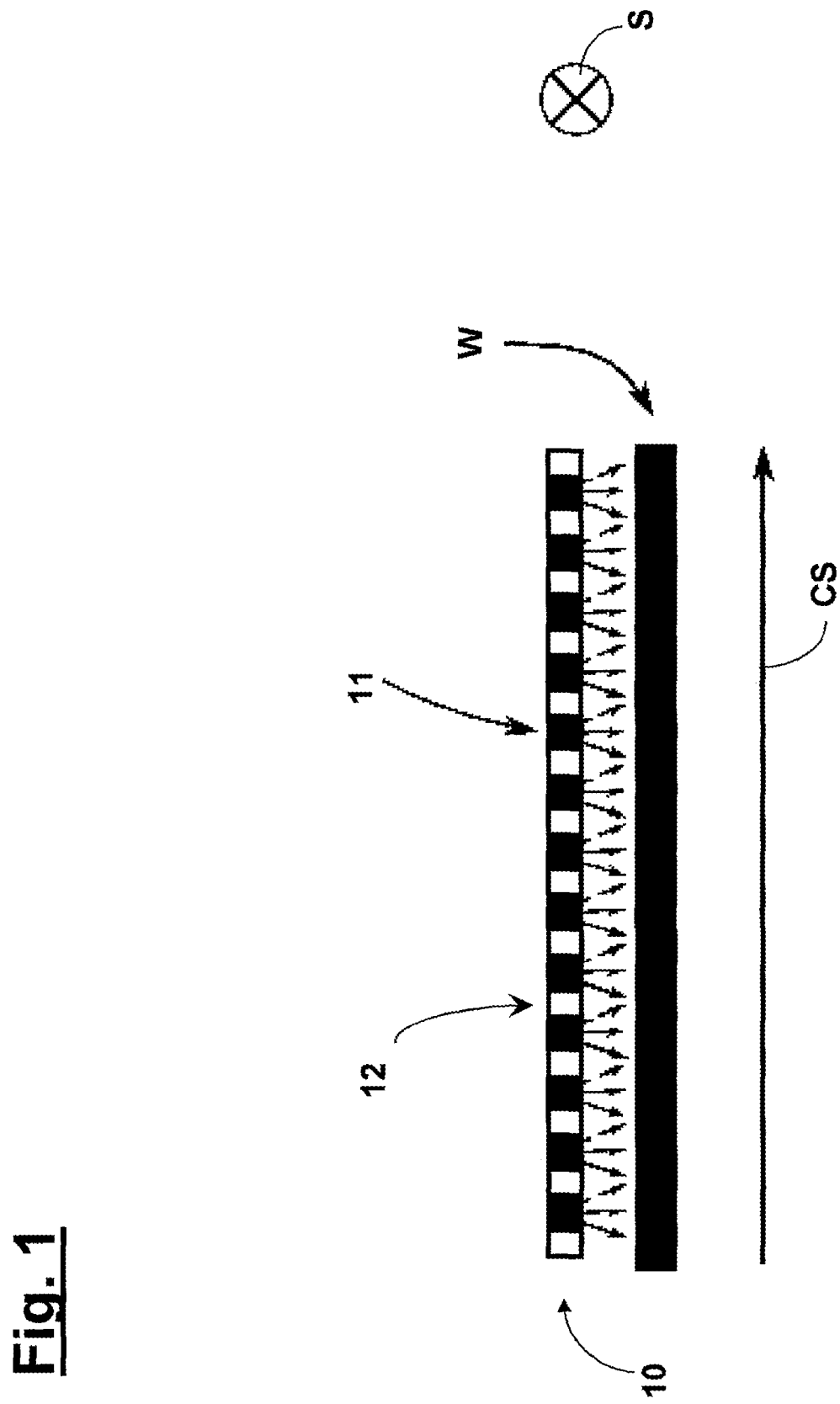
FIGS. 1-4 show schematic illustrations for elucidating various embodiments for correcting structure size errors on an exposed wafer.

As far as firstly the alteration of the structure size according to the disclosure is concerned, by way of an aftertreatment of the wafer or photoresist following the actual exposure process, in a first embodiment in accordance with FIG. 1, it is possible to directly influence the free hydrogen ions present in the photoresist by spraying acids (in order to increase the concentration of free hydrogen ions) and/or acid scavengers ("Base Quenchers") (in order to reduce the concentration of free hydrogen ions) onto the wafer W or the photoresist via corresponding spraying devices 11 (for applying acids) and/or 12 (for applying acid scavengers). In FIG. 1, "S" denotes the scanning direction, and "CS" the direction extending perpendicular thereto in the wafer plane ("Cross-Scanning Direction").

In this case, in a manner known per se, the abovementioned acid scavengers or "Base Quenchers" have the property of binding irreversibly to free hydrogen ions, as a result of which a threshold-value-dependent behavior of the photoresist (to the effect that free hydrogen ions are available for chemical reactions only above a specific light dose) is attained. Acid scavengers can be bases, in particular, since the latter can bind acids to form a salt.

The addition both of acids and of acid scavengers that is possible in accordance with FIG. 1 makes it possible here optionally to increase or to decrease the number of available free hydrogen ions, which is ultimately crucial for the polymer cutting-up rate and thus the solubility during the subsequent chemical development. In this case, an increase in the number of free hydrogen ions in a so-called positive resist during the subsequent "baking process" ("Post-Exposure Bake"), already mentioned in the introduction results in an increase in the rate of cutting apart of the polymers present in the photoresist, and thus ultimately in an increased solubility of the photoresist, whereas a reduction of the number of free hydrogen ions leads to the opposite effect. For a so-called negative resist, the relationship between number of free hydrogen ions and solubility of the photoresist is exactly opposite to that of a positive resist.

In a further embodiment, for altering the structure size, it is also possible to carry out a post-exposure of the photoresist with a wavelength deviating from the operating wavelength of the projection exposure apparatus. This can exploit the fact that conventional photoresist materials are generally sensitive across a wider wavelength range, such that even light having a wavelength deviating from the operating wavelength of the projection exposure apparatus can be used for the post-exposure.

Figure 2:
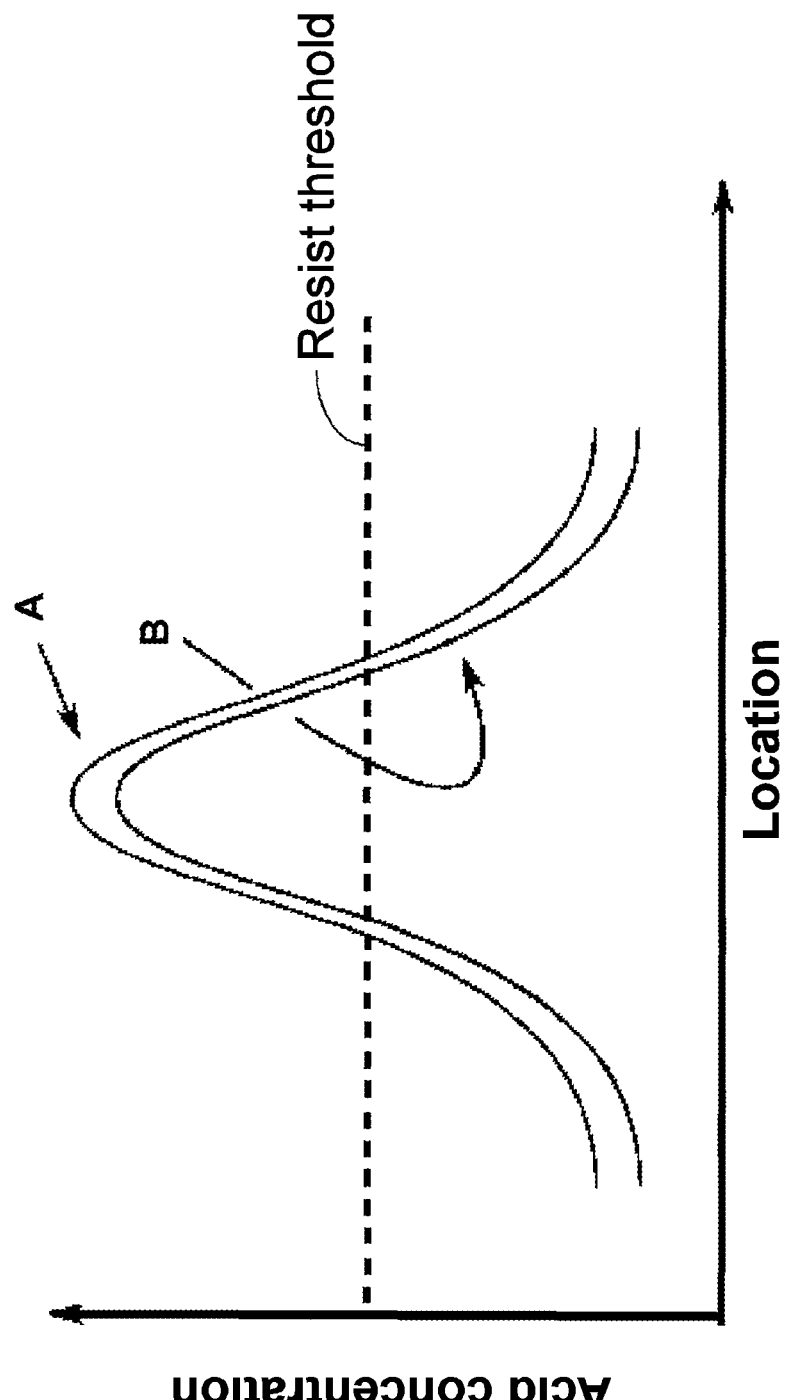
Figure 3:
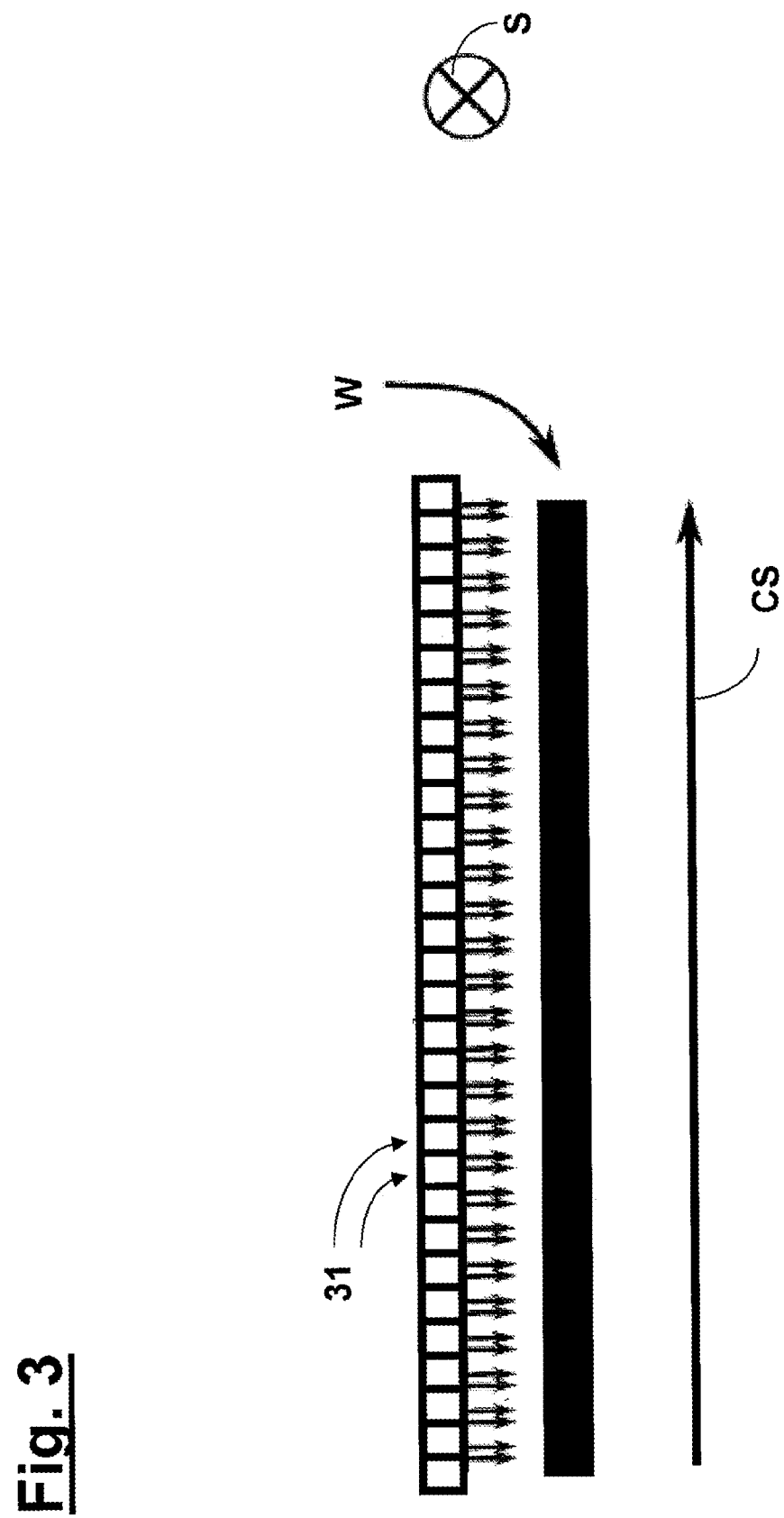

Merely by way of example, an arrangement of light-emitting diodes (LEDs) 31 is usable in accordance with FIG. 3. The irradiation of the already exposed wafer W using such LEDs has the effect, as indicated in FIG. 2, that the relevant location-dependent curve of the acid concentration is shifted upward or toward higher values of the acid concentration with the consequence that—as shown by a qualitative comparison of the curves "B" ("before post-exposure") and "A" ("after post-exposure")—an alteration of the structure size of the structure printed microlithographically in each case is achieved on account of the resist threshold remaining unchanged. It should be taken into consideration here that, in accordance with this embodiment, an alteration of the structure size is able to be carried out in each case "only in one direction" (i.e. only in the sense of an increase or only in the sense of a decrease")—depending on whether a positive resist or a negative resist is used. In this approach, therefore, care should preferably be taken to ensure that the actual radiation dose generated by the projection exposure apparatus always lies below the target dose.

In accordance with a further embodiment, not explicitly illustrated, light-emitting diodes 31 in accordance with FIG. 3 can be combined with spraying devices 12 dispensing acid scavengers in accordance with FIG. 1, thereby enabling an alteration of the acid concentration "in both directions".

The most widely used photoresists are those of the type described previously in which the absorption of a photon having an operating wavelength results in acid production just like an absorption of a photon in a certain first wavelength range that is different than the operating wavelength. US 2016/0048080 A1 discloses applying on a wafer W a layer including not just a photoresist in the actual sense but further substances capable of a reaction to light.

The layer can contain, in particular, substances (photodestructive bases) that liberate acid scavengers, that is to say in particular bases, under exposure. The substances can be sensitive in particular in a second wavelength range, in which the actual photoresist releases no free acids upon exposure.

Figure 18:
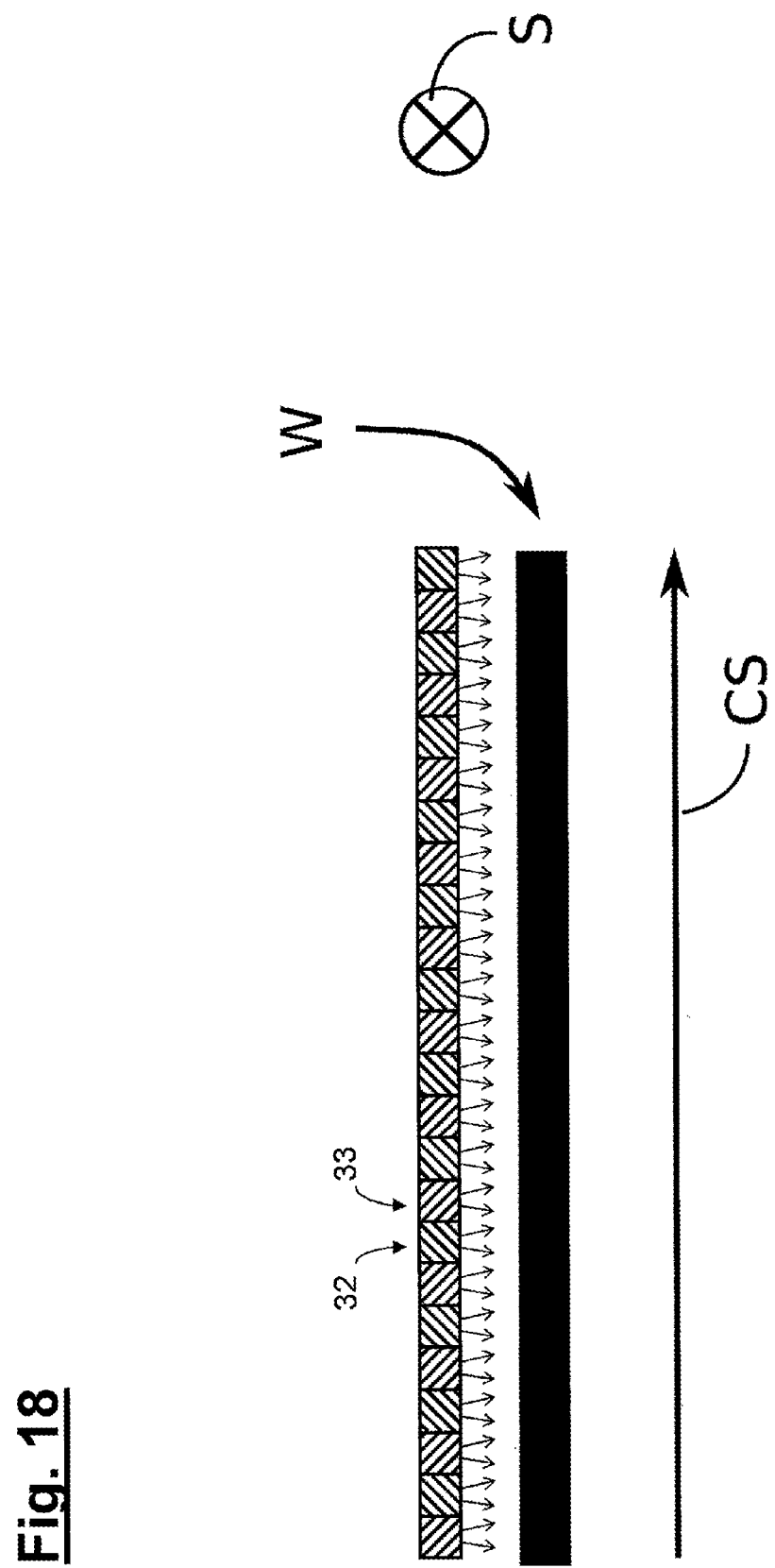
FIG. 18 shows a schematic illustration for elucidating an alternative embodiment for correcting structure size errors on an exposed wafer.

In accordance with a further embodiment illustrated in FIG. 18, a wafer W provided with a layer of this type is irradiated by first light-emitting diodes 32, which emit radiation from a first wavelength range, as a result of which free acids can be produced, and is irradiated by second light-emitting diodes 33, which emit radiation from a second wavelength range, as a result of which acid scavengers are produced.

In accordance with a further embodiment, the layer applied to the wafer W can contain a photosensitizer precursor. Photosensitizers are known from US 2016/0048080 A1. Upon exposure with radiation having the first operating wavelength, the photosensitizer precursor is cleaved to form a photosensitizer. Upon subsequent illumination with radiation in a third wavelength range, the photosensitizer (but not the photosensitizer precursor) leads to the production of free acid. The local density of produced acid is thus proportional to the intensity of the operating wavelength multiplied by the intensity in the third wavelength range. In one embodiment in accordance with FIG. 3, the light-emitting diodes 31 can emit radiation in such a third wavelength range provided that the layer on the wafer W includes a photosensitizer precursor.

Figure 4:
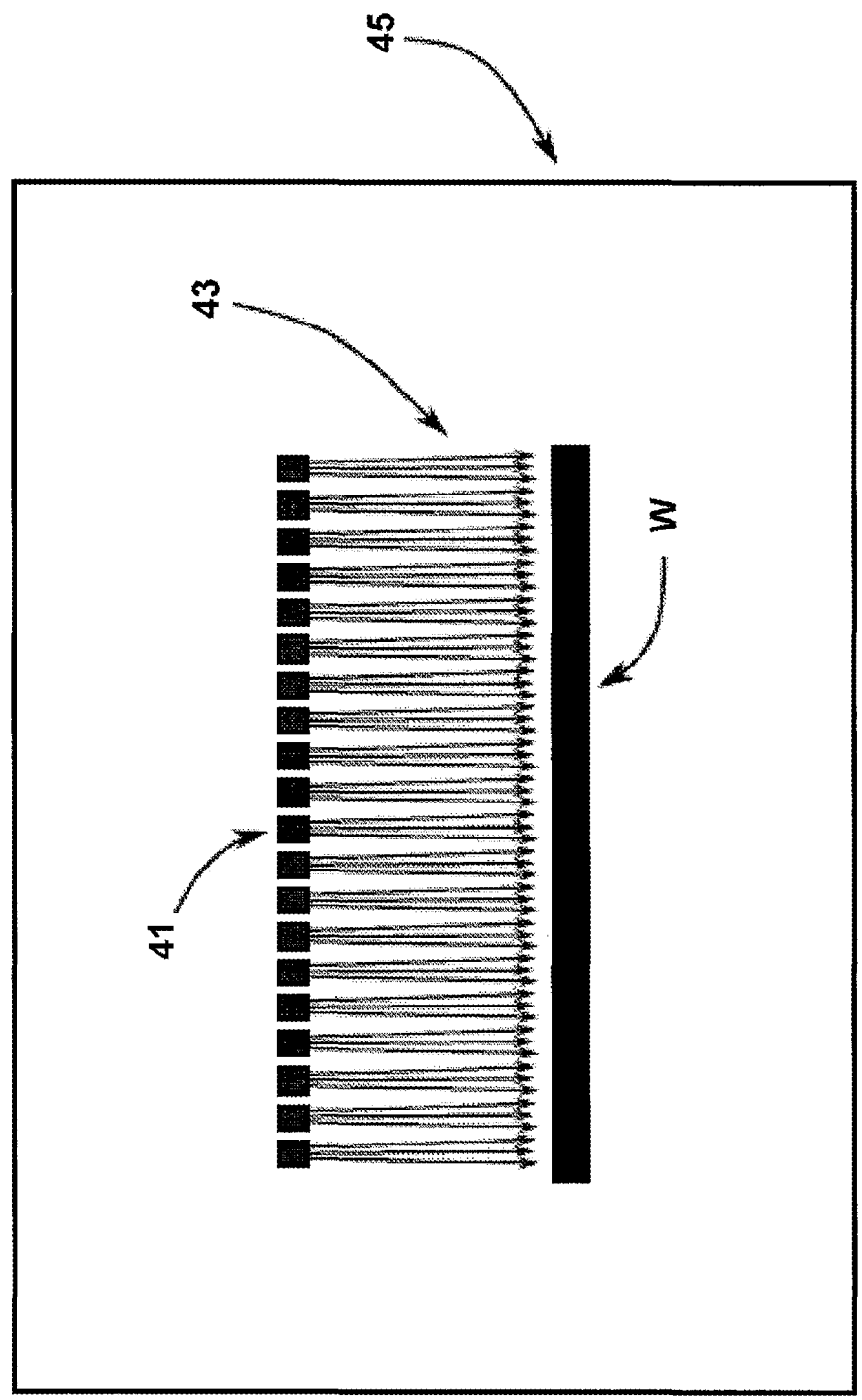

In accordance with a further embodiment indicated schematically in FIG. 4, an influencing of the structure size can also be achieved by altering the temperature set during the subsequent baking process ("Post Exposure Bake"). This approach can take account of the circumstance that the effect or polymer cutting rate obtained during the subsequent baking process as a result of the free hydrogen ions effective here is temperature-dependent. In accordance with FIG. 4, a global temperature offset can be set using a phase 45, wherein it is possible to set local temperature differences on the photoresist using an infrared illumination element 41. The infrared illumination element 41 can include, in particular, a two-dimensional matrixlike arrangement of individual infrared sources. In further embodiments, it is also possible to use a one-dimensional arrangement of infrared sources in conjunction with a device that deflects the infrared radiation in one spatial direction or dimension or else a substantially point-type infrared source in conjunction with a device that deflects the infrared beam in two mutually perpendicular spatial directions or two-dimensionally.

As an alternative to the use of a one- and/or two-dimensional deflection device for the radiation emitted by an infrared illumination element 41, an alteration of the impingement locations of the radiation on the wafer W can also be achieved via a suitable movement of the wafer W relative to the infrared illumination element.

Various embodiments for altering the structure position (i.e. for eliminating possible overlay errors) are described below with reference to FIG. 5 to FIG. 7. These embodiments differ, in principle, from the measures for altering the structure size described above with reference to FIG. 1 to FIG. 4 in that a preferred direction along which the centroid of the respective structure is displaced is distinguished, in principle, for altering the structure position.

Figure 5:
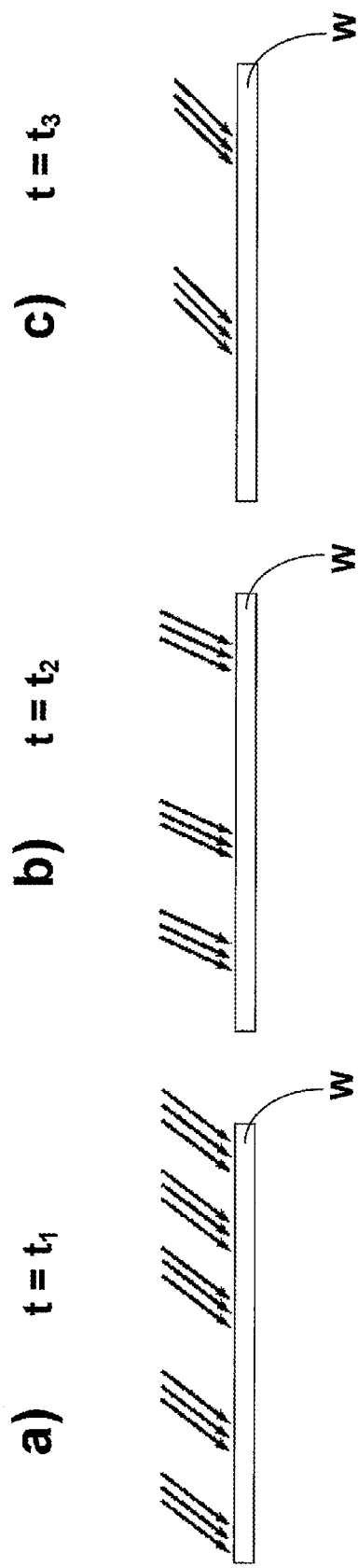
FIGS. 5-7 show schematic illustrations for elucidating various embodiments for correcting structure position errors on an exposed wafer.
Figure 6:
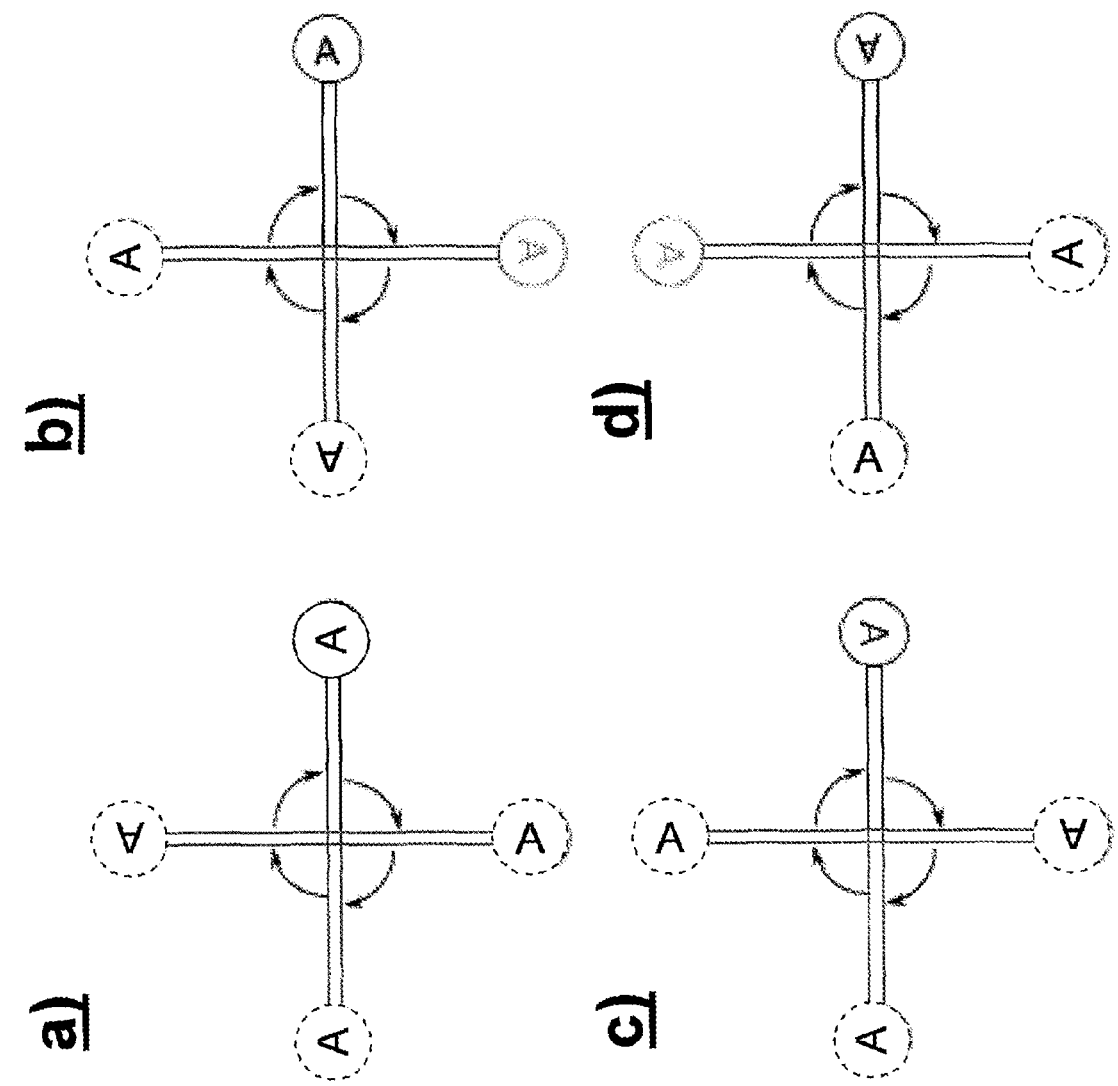

In accordance with FIG. 5, for this purpose it is possible to use an etching process in which, in a manner known per se, an oblique impingement of the ions directed onto the respective surface leads to the targeted etching away of side walls of the relevant structure (which is accompanied by a displacement or a "migration" of the centroid of the structure). Depending on the desired alteration of the structure position in a region of the wafer W, the ions used for etching impinge on the region at an adapted predefined angle. In accordance with FIGS. 5a-c, in this case, regions of a wafer W which are intended to be etched at mutually different angles of incidence can also be etched temporally successively (i.e. at different points in time $t_1$, $t_2$ and $t_3$, respectively).

An alteration of the size of the structure that possibly takes place in addition owing to the etching process can be corrected with the aid of one of the methods described above with reference to FIG. 1 to FIG. 4.

In a further embodiment, for altering the structure position, it is also possible to carry out heating of the photoresist in conjunction with a displacement of the structures produced therein by the generation of defined forces: while flowing of the photoresist is brought about by heating of the photoresist beyond the flow temperature thereof (which may be e.g. of the order of magnitude of 120° C.), an asymmetry of this flowing can be achieved by way of a force acting parallel to the wafer surface. This last can be achieved e.g. via a repeated off-axis rotation of the wafer (with in each case a different orientation of the wafer relative to the connecting axis "wafer rotation axis"), as is illustrated merely schematically in FIGS. 6a-d (wherein the respective orientation of the wafer is indicated by the orientation of the letter "A"). During each rotation (with in each case a predefined orientation of the wafer with respect to the connecting axis "wafer rotation axis"), it is possible to achieve a displacement of the relevant structure in a specific direction, wherein the extent of this movement can be determined by the temperature of the photoresist, the temperature being able to be set locally by way of a location-dependent heating. An arrangement analogous to FIG. 4 can once again be used for this purpose.

In further embodiments, a displacement of the structure positions produced on the wafer can also be carried out via a spatially resolved subsequent IR illumination using a device analogous to the embodiment from FIG. 3, wherein the intensity of the flowing of the photoresist here can likewise be altered in a location-dependent manner. For displacing a structure position, this has to be combined with impressing a directional force with a component tangential to the surface of the wafer W, e.g. according to an embodiment in accordance with FIG. 6.

Figure 7:
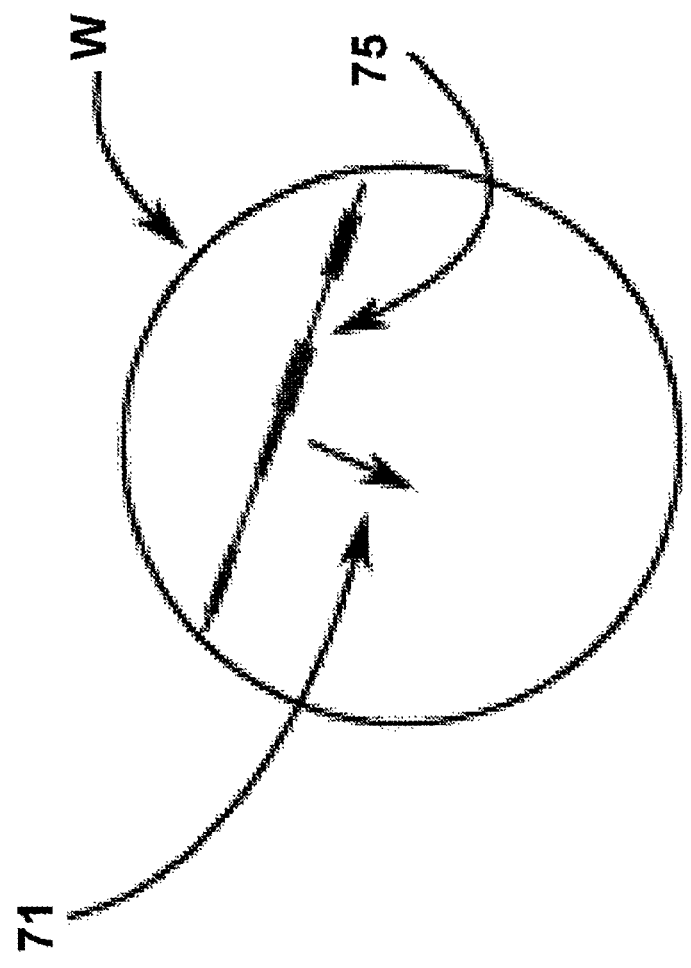

In accordance with a further embodiment illustrated merely schematically in FIG. 7, a location-dependent displacement of structure positions can also be achieved by temporally varying a heating region 75 of the photoresist by a (in the example linear) region 75 in which the photoresist is heated being moved across the wafer in a specific movement direction 71.

Even though a description has been given above of diverse embodiments for realizing the aftertreatment according to the disclosure of the wafer for the purpose of correcting deviations of structure properties (i.e. structure size and/or structure position) on the exposed wafer, in the context of the present disclosure it is desirable temporally firstly to carry out the ascertainment of the relevant deviations.

In this respect, various embodiments are described below with reference to FIG. 8 to FIG. 17, wherein here, too, a distinction is once again drawn between structure size or CD error and structure position or overlay error. Specifically, with reference to FIG. 8 to FIG. 14 a description is given of embodiments for ascertaining deviations with regard to the structure size (which deviations can then be corrected e.g. in accordance with one of the embodiments from FIG. 1 to FIG. 4), whereas with reference to FIG. 15 to FIG. 17 a description is given of embodiments for determining deviations of the structure position (which deviations can then be corrected e.g. in accordance with one of the embodiments from FIG. 5 to FIG. 7).

As far as firstly ascertaining deviations with regard to the structure size is concerned, this can be carried out according to the disclosure on the basis of the concentration of free hydrogen ions produced in the photoresist or on the wafer. Since correction methods for the structure size alter the number of free hydrogen ions, in particular, the desired correction can be determined directly by ascertaining the actual number of hydrogen ions present, without a structure size on the wafer having to be explicitly determined for this purpose.

The concentration of free hydrogen ions can be determined e.g. on the basis of a measurement of the change in impedance of the photoresist. This can exploit the fact that the free hydrogen ions and/or acids produced during the exposure alter the impedance of the photoresist, wherein the local acid density can in turn be derived from a measurement of this change in impedance. In this respect, reference is made to the publications C. M Berger, J. D. Byers, and C. L. Henderson, *J. Electrochem. Soc.*, 151, G119 2004; C. M Berger and C. L. Henderson, *J. Vac. Sci. Technol. B*, 22, 1163 2004 and C. Berger and C. L. Henderson, *Proc. SPIE*, 5753, 1076 2005.

In a further embodiment, the relevant resist parameters (i.e. in particular the local acid density and/or the concentration of free hydrogen atoms) can also be ascertained with the aid of infrared spectroscopy. A so-called Fourier transformation infrared spectrometer (FTIR spectrometer) is suitable here, in particular, since a measurement of the time dependence of the field strength that is carried out in this case is able to be implemented metrologically more simply than ascertaining this variable as a function of the wavelength.

In further embodiments, instead of the measurement of the concentration of free hydrogen ions that is present in the photoresist, it is also possible to ascertain the cause of the establishment of this concentration, i.e. the intensity distribution or pupil filling respectively produced within the illumination unit or the projection lens.

Figure 8:
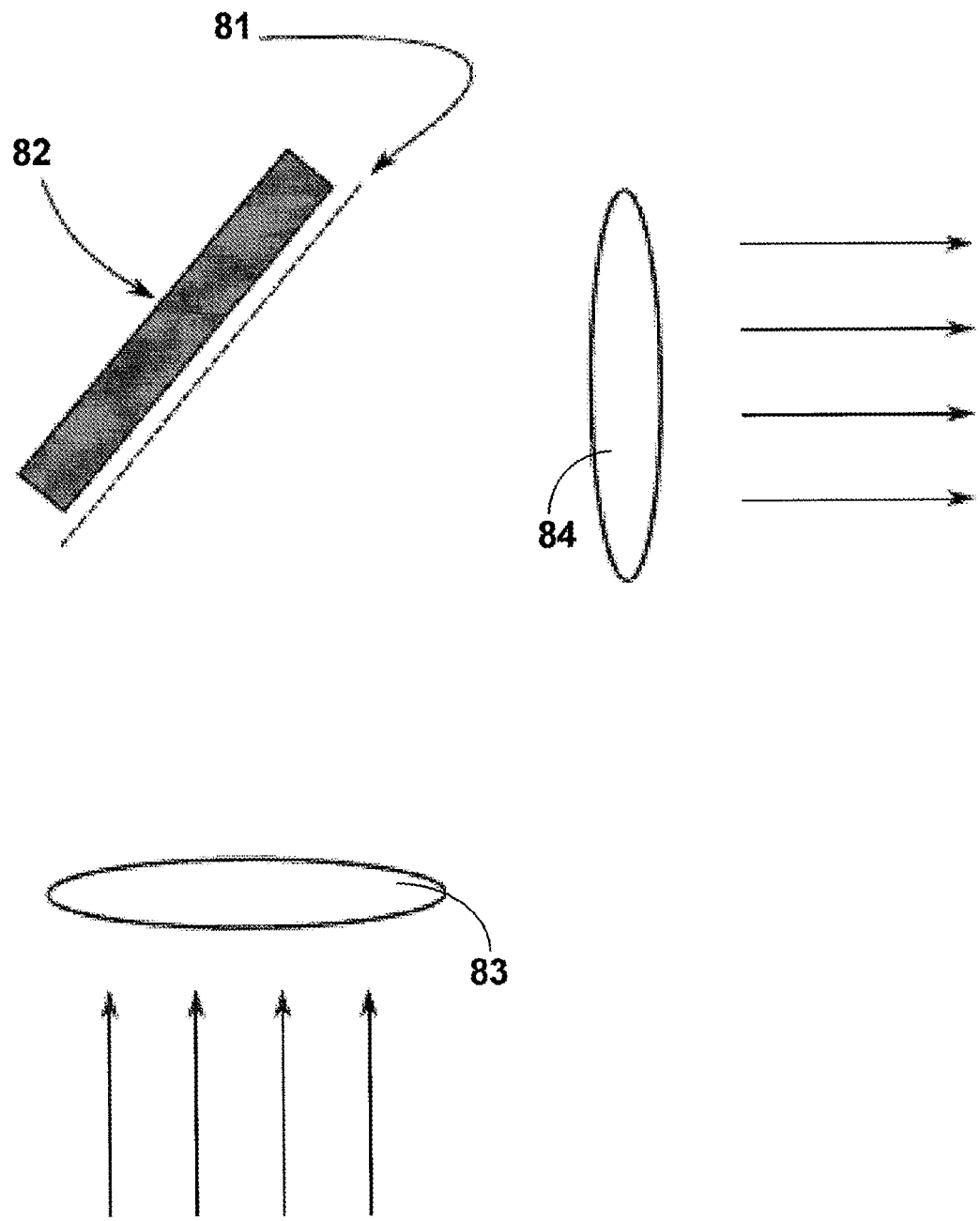
FIGS. 8-14 show schematic illustrations for elucidating various embodiments for ascertaining structure size errors on an exposed wafer.

For this purpose, in accordance with FIG. 8, in a system designed for operation at wavelengths in the DUV range (e.g. 193 nm), the local illumination dose can be ascertained by a comparatively small proportion of the electromagnetic radiation being coupled out with the aid of a perforated mirror. Such a mirror is designated by "81" in FIG. 8, wherein merely in a simplified manner only one lens element 83 and 84 in each case is depicted in the light propagation direction upstream and respectively downstream of the perforated mirror 81. In FIG. 8, "82" denotes an energy sensor for measuring the energy of the radiation coupled out via the perforated mirror 81. By comparison with a partly transmissive mirror (likewise usable in principle), the use of a perforated mirror 81 has the advantage of greater long-term constancy of the splitting ratio used for the electromagnetic radiation.

The functionality (already known per se for the dose control of the light source) of the perforated mirror 81 can then be extended according to the disclosure in the sense of a spatially resolved measurement of the intensity in order to be able to calculate the location dependence of the illumination at the reticle. Here the sensor 82 should be configured such that it can also determine a location-dependent dose in addition to a total illumination dose, that is to say the dose integrated over the entire sensor. While the total illumination dose has to be determinable comparatively rapidly since the total illumination dose is used for readjusting the light source power, the spatially resolved measurement—since it does not serve for readjusting the light source power—can be carried out comparatively slowly (e.g. on a time scale of 1 s or more).

Figure 9:
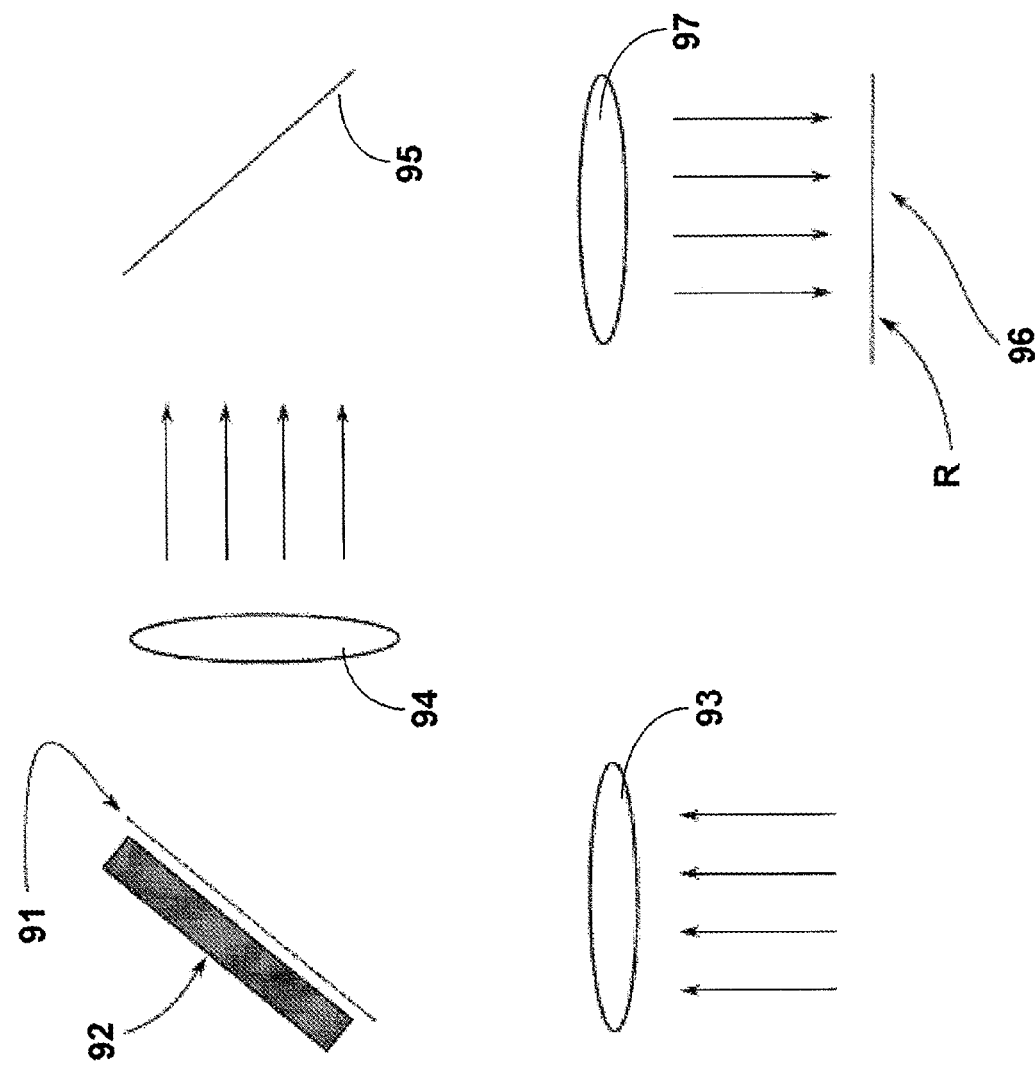

FIG. 9 shows, in a schematic illustration, a set-up in which the different time scale of the two measurements is used to the effect that two separate measuring devices are used for this purpose. The location dependence of the illumination at the reticle R is determined using an energy or intensity sensor 96, which is introduced into the beam path in the vicinity of the reticle at suitable time intervals. A perforated mirror analogous to FIG. 8 is designated by "91" in FIG. 9, wherein merely in a simplified manner only respectively one lens element 93 is depicted in the light propagation direction upstream of the perforated mirror 91 and a lens element 94, a deflection mirror 95 and a further lens element 97 are depicted downstream of the perforated mirror 91. "92" denotes an energy sensor for the (continuous and location-independent) measurement of the energy of the radiation coupled out through the perforated mirror 91.

Figure 10:
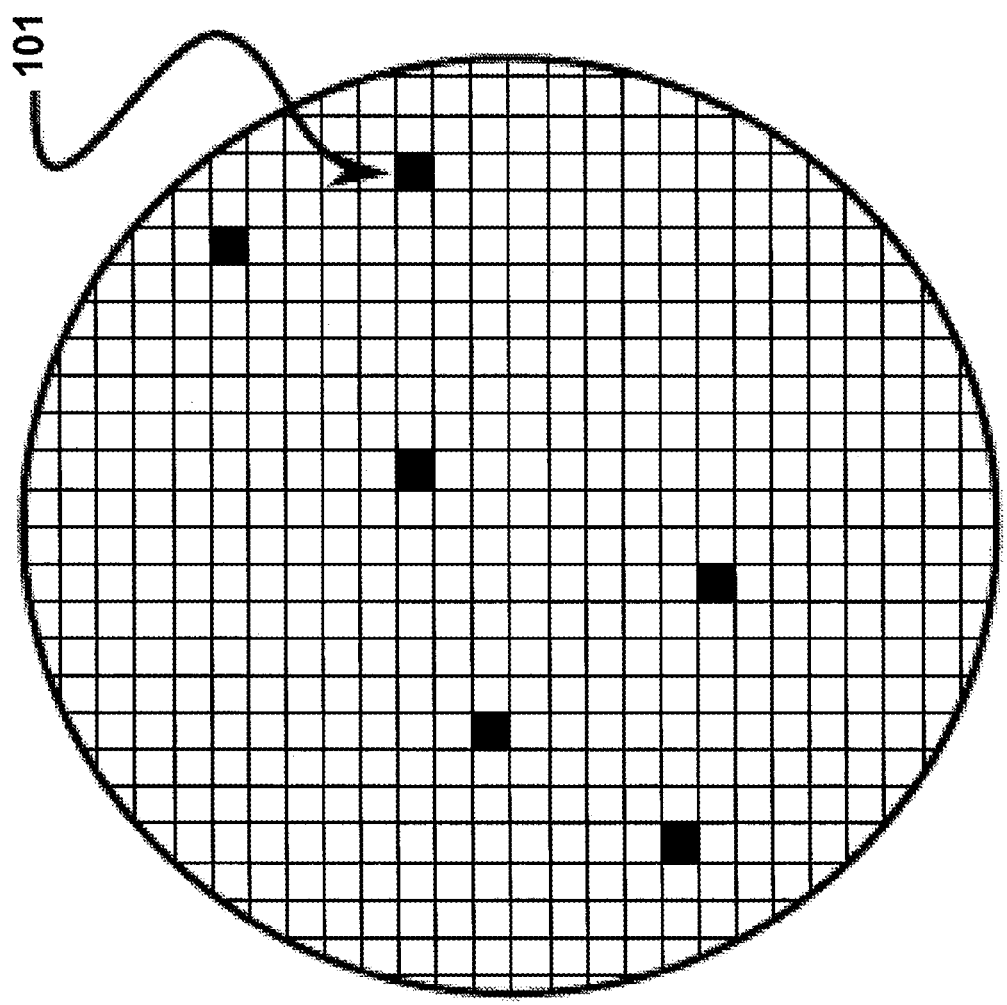
Figure 11:
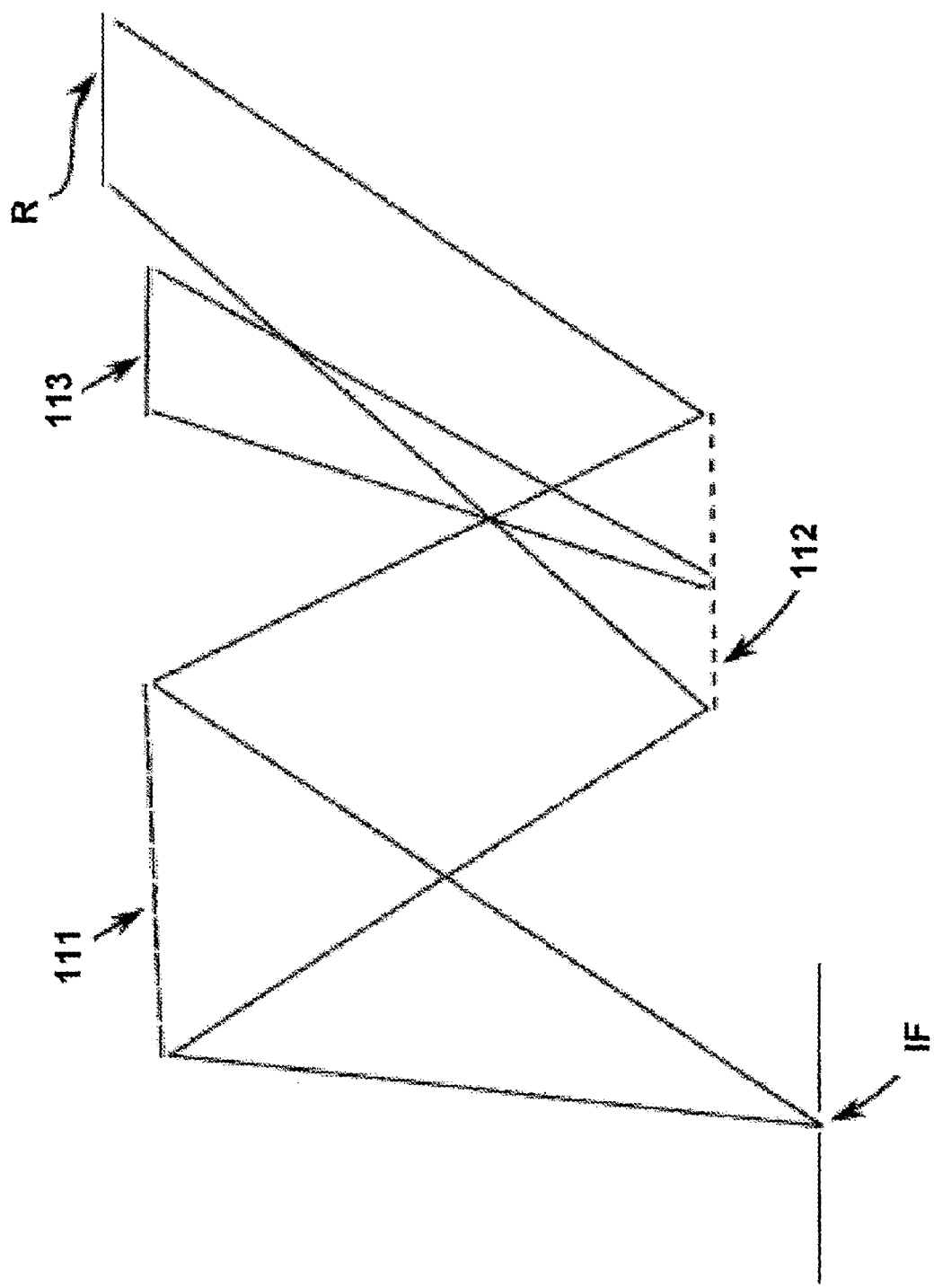

In further embodiments, the desired information about the location dependence of the reticle illumination can also be determined in a projection exposure apparatus designed for operation in the EUV, in respect of which embodiments are described below with reference to FIG. 10 to FIG. 12.

In principle, from time to time a measurement of the intensity profile generated in the illumination unit can be carried out for this purpose. In accordance with FIG. 10, for this purpose, e.g. in a mirror arrangement provided in the illumination unit and composed of a multiplicity of mutually independently adjustable mirror elements 101, individual mirror elements from among the mirror elements can be used for illuminating suitably positioned energy sensors. In particular, the effect of fluctuations of the light source on the location-dependent illumination of the reticle R can be determined in this way. In further embodiments, in accordance with FIG. 11, the radiation of individual field facets 111 and/or pupil facets 112 can be directed onto a sensor 113, spaced apart from the reticle R, for measuring the light intensity, in order to obtain correspondingly spatially resolved intensity data. In this case, in FIG. 11, the intermediate focus between light source and illumination unit is designated by "IF".

Figure 12:
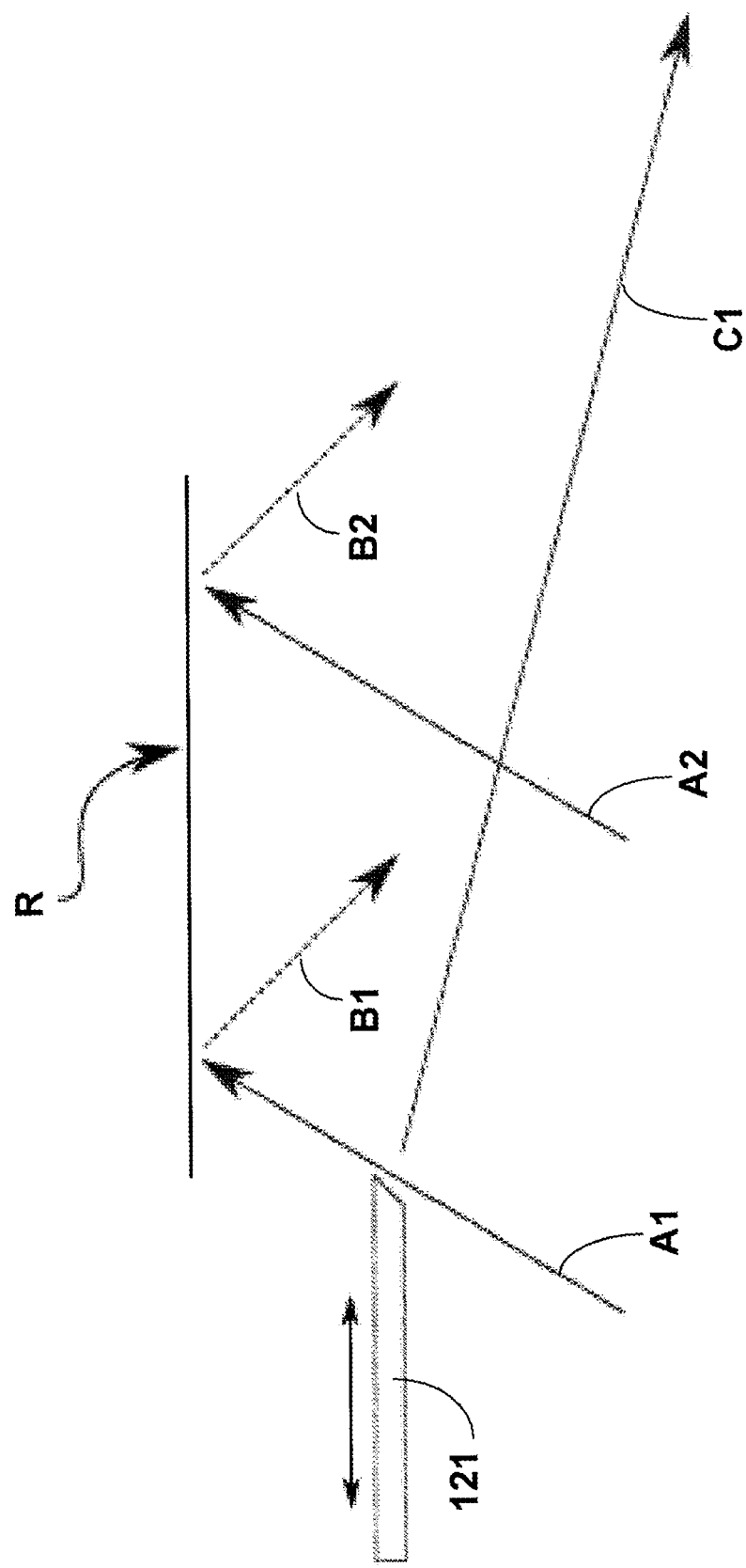
Figure 13:
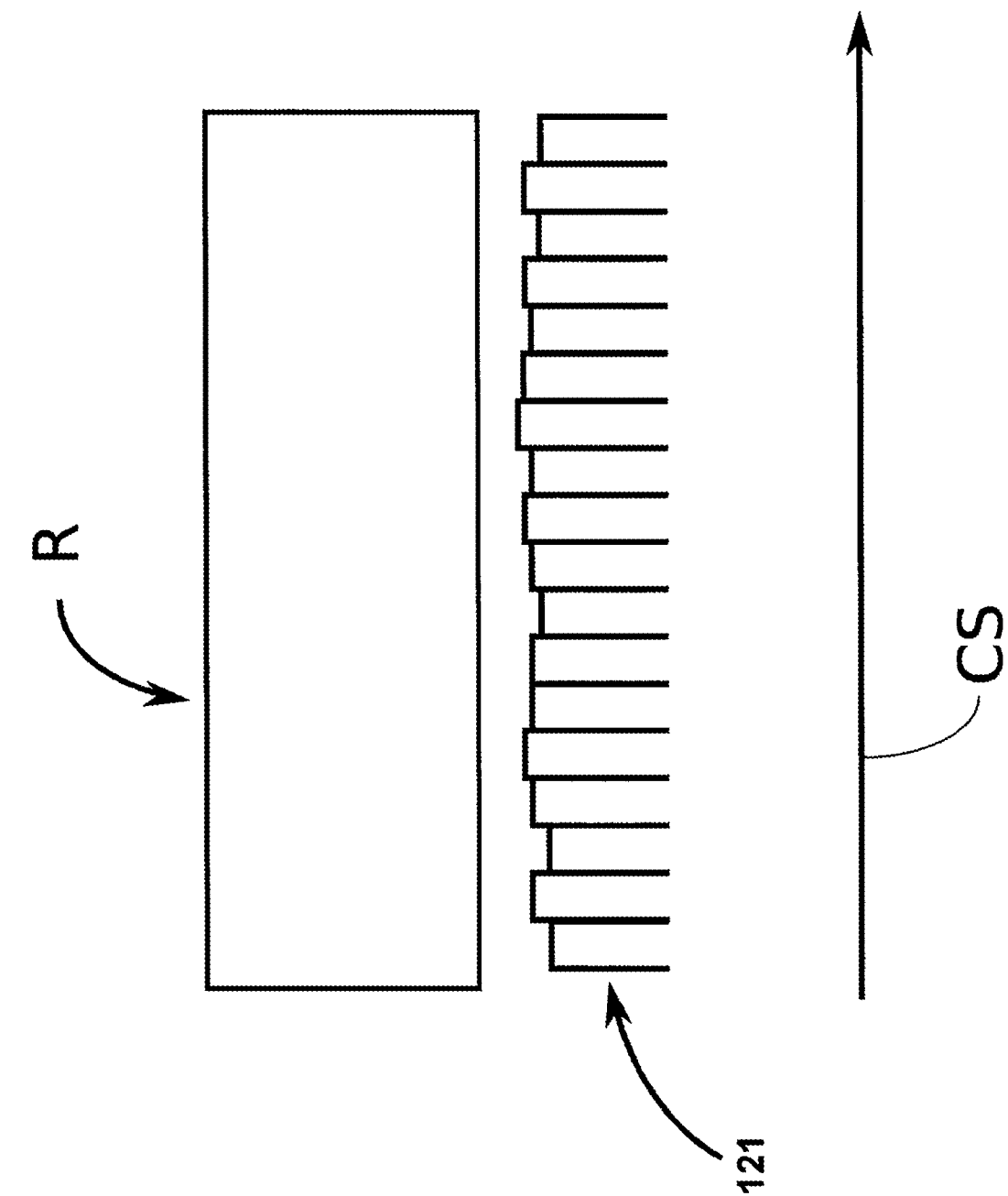

In accordance with FIG. 12, in a further embodiment, part of the electromagnetic illumination radiation can be coupled out and passed to a sensor with the aid of a unit 121 known per se, which unit includes substantially rod-shaped elements that are selectively insertable into the beam path independently of one another in a near-field plane. FIG. 13 shows a plan view of the unit 121, which can be used to realize a spatially resolved intensity measurement along the direction which extends transversely with respect to the scanning direction and is designated by "CS". In FIG. 12, rays directed onto the reticle R are designated by "A1" and "A2", respectively, rays reflected at the reticle R are designated by "B1" and "B2", respectively, and a ray coupled out in the direction of the sensor (not depicted) is designated by "C1".

Figure 14:
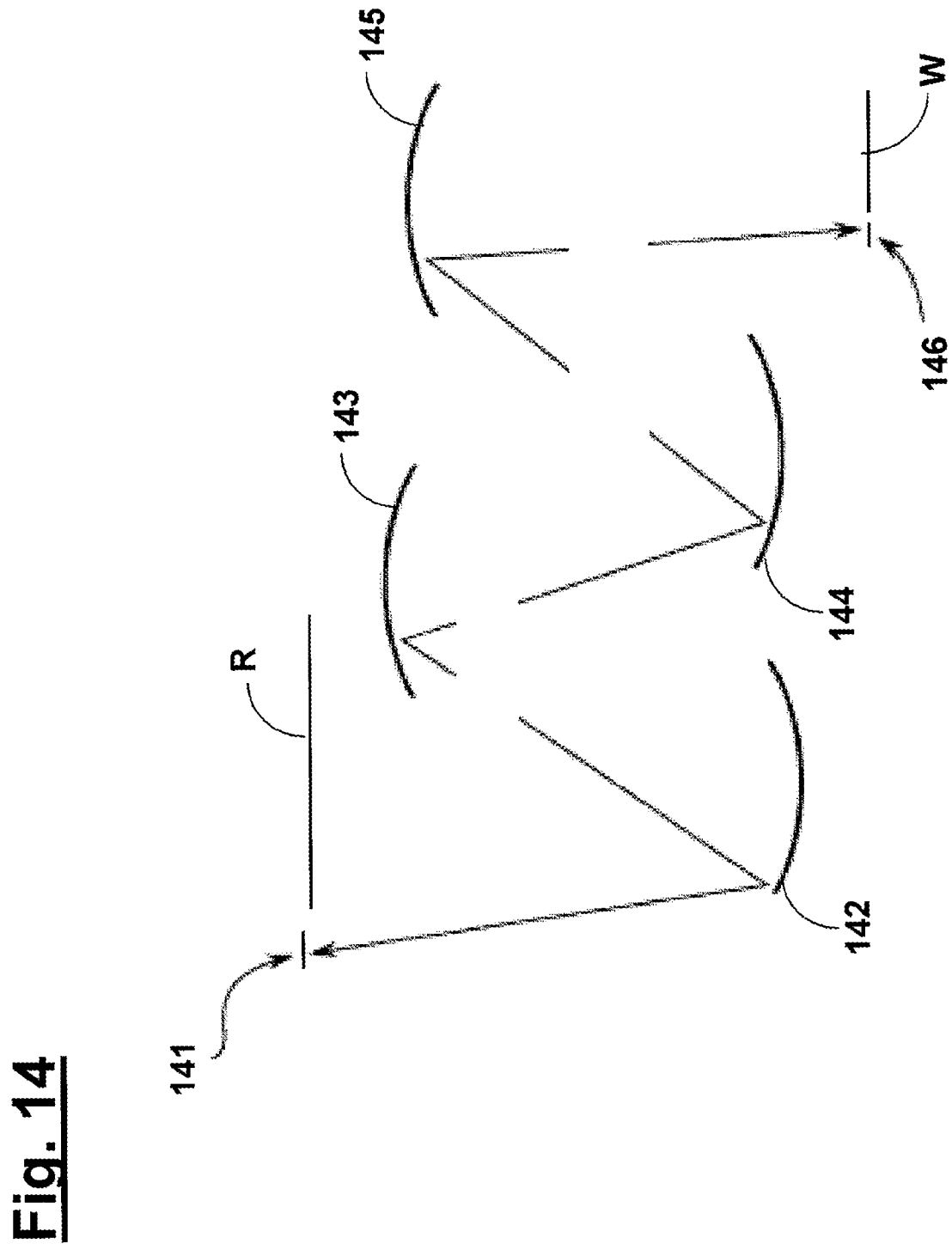

FIG. 14 shows merely schematically an arrangement for ascertaining transmission fluctuations in the projection lens of a projection exposure apparatus designed for operation in the EUV range, the arrangement likewise being usable in the method according to the disclosure. In accordance with FIG. 14, a light ray passes through the projection lens via mirrors 142-145 firstly as far as a grating 146 arranged adjacent to the wafer W, and back from the grating 146 to a sensor 141 arranged adjacent to the reticle R. The sensor 141 can measure the ray attenuation that takes place in the projection lens, from which in turn it is possible to derive information about the gas pressure in the projection lens.

Figure 15:
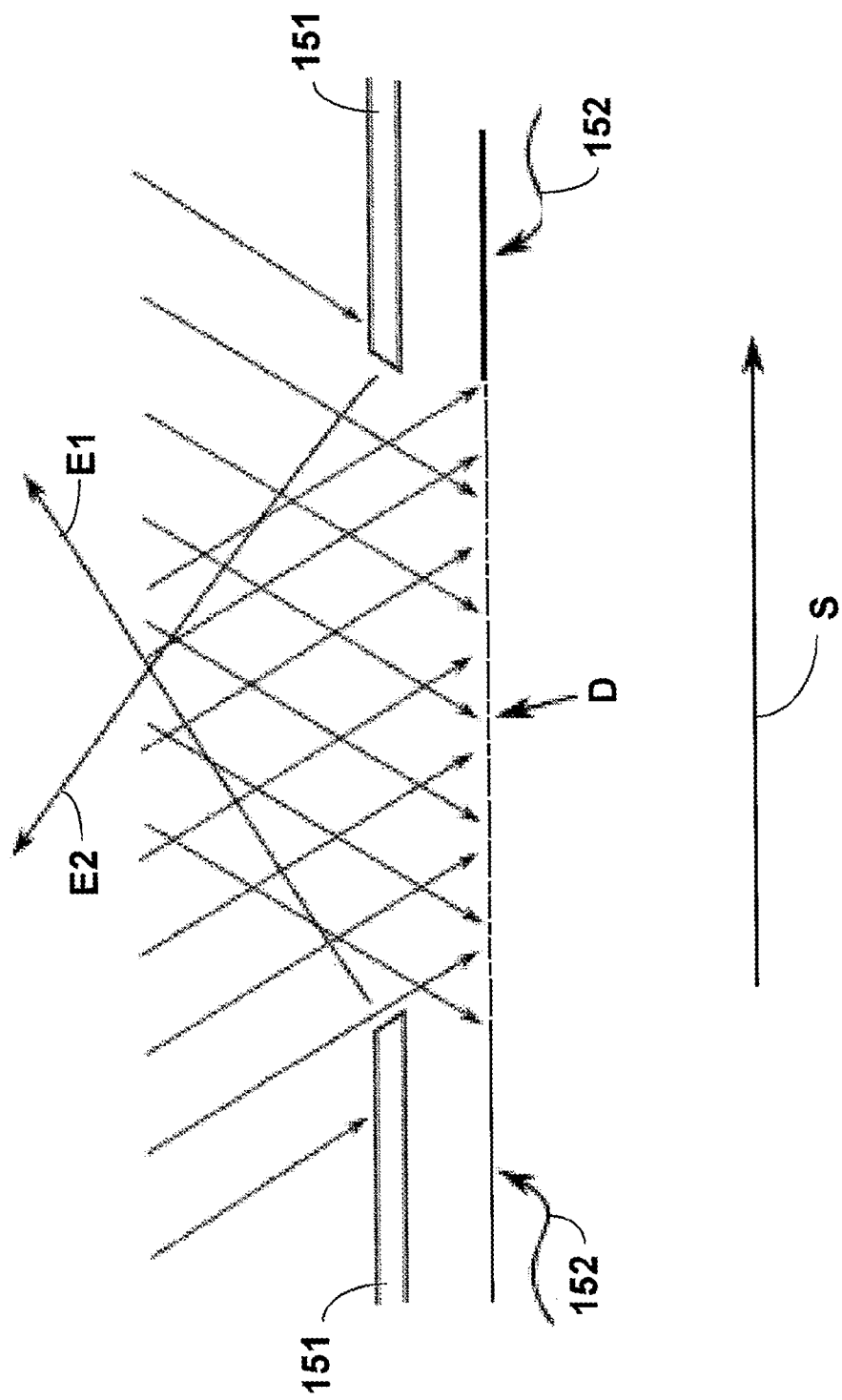
FIGS. 15-17 show schematic illustrations for elucidating various embodiments for ascertaining structure position errors on an exposed wafer.
Figure 16:
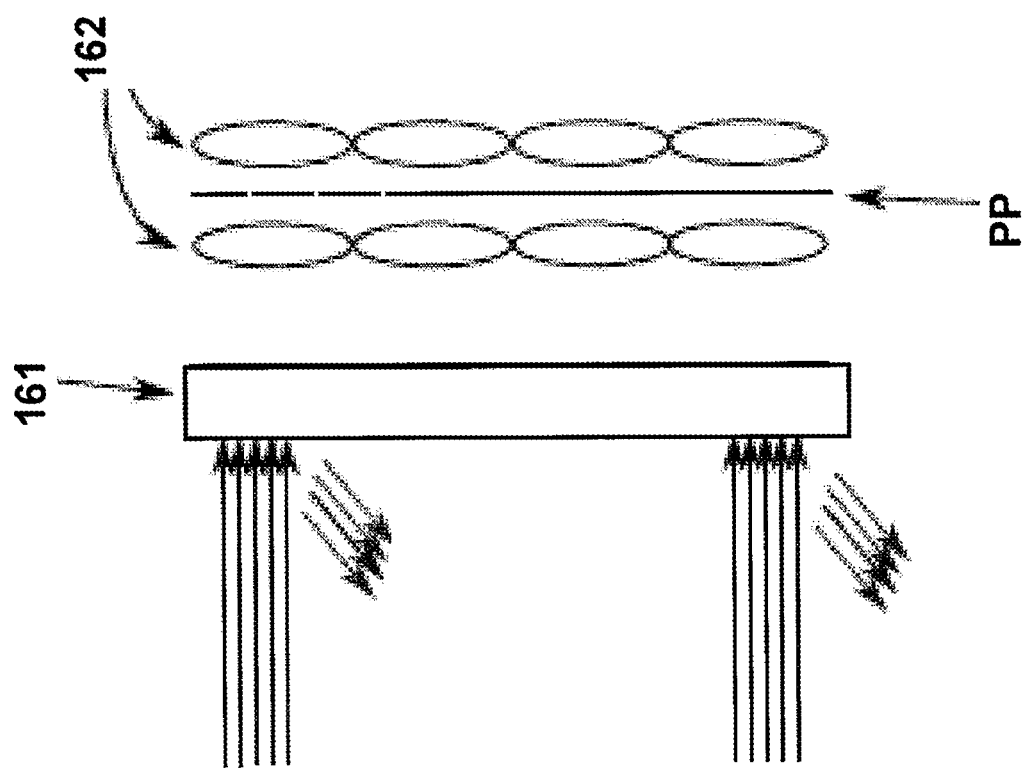
Figure 17:
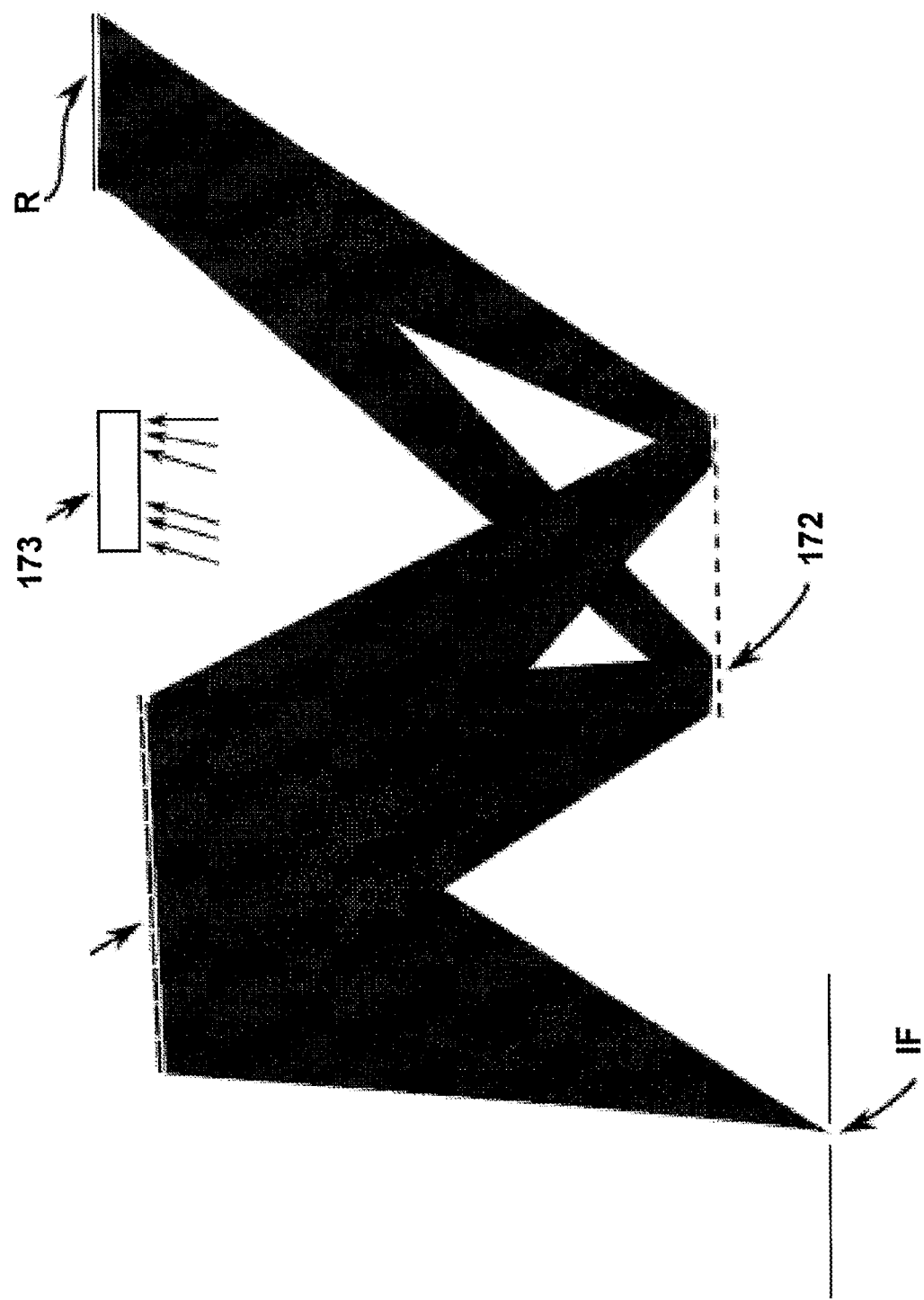

FIG. 15 to FIG. 17 show schematic illustrations for elucidating various embodiments for ascertaining deviations of the structure position and/or overlay errors. Even if it is possible to determine overlay errors in principle with the aid of a measurement that takes place directly on the wafer, an examination of the causes of the relevant structure position and/or overlay errors is carried out instead in the embodiment according to the disclosure—with the aim of the sought simplification of the design complexity. That can in turn specifically include determining the pupil properties, in particular the telecentricity properties. Together with information about the current defocus that is typically present on the basis of the measurement of the wafer before the exposure and the tracking of the wafer in a direction normal to the wafer's surface to be exposed during the exposure, structure position properties can be determined from pupil properties.

In principle, for this purpose, in a system designed for operation in the DUV range (e.g. at wavelengths of approximately 193 nm), it is possible once again to use a perforated mirror analogously to FIG. 8 and FIG. 9, wherein here the intensity information is not derived for a field plane (that is to say in a conjugate manner with respect to the reticle), but rather for a pupil plane.

Furthermore, in a set-up for spatially resolved telecentricity measurement as illustrated schematically in FIG. 15, light can be coupled out via an arrangement 151 configured analogously to FIG. 13 and composed of substantially rod-shaped elements which are selectively insertable into the beam path independently of one another and which are arranged in displaceable fashion relative to the light propagation direction just upstream of a field plane that is conjugate with respect to the reticle plane. "152" denotes REMA stops of a reticle masking system. The rays designated by "E1" and "E2", respectively, pass to a measuring unit (not shown) in accordance with FIG. 15.

In accordance with a further embodiment illustrated schematically in FIG. 16, also in a projection exposure apparatus designed for wavelengths in the DUV range, light can be directed via a diffusing plate 161, which is situated near a pupil plane PP or a field defining element 162 arranged there, to a camera-based sensor (not illustrated) for pupil measurement, in order to realize a telecentricity determination (not spatially resolved here). As an alternative to the use of a diffusing plate, it is also possible to use the reflection of the illumination light at an optical component arranged in the vicinity of a pupil plane PP.

FIG. 17 shows merely schematically one embodiment in an illumination unit of a projection exposure apparatus designed for operation in the EUV, wherein here the intermediate focus is designated by "IF", a field facet mirror is designated by "171" and a pupil facet mirror is designated by "172". The electromagnetic radiation brings about a significant heat input into the pupil facet mirror 172, which can in turn be observed or detected using a thermal imaging camera 173. In alternative embodiments, the amount of heat dissipated by a cooling device can also be evaluated. By comparing the amount of heat dissipated and/or radiation deflected at different locations on the pupil facet mirror 172, it is possible to ascertain the location of the centroid of the heat input on the pupil facet mirror 172 and thus the centroid of the illumination pupil and/or the magnitude of the telecentricity of the illumination pupil.

Figure 19:
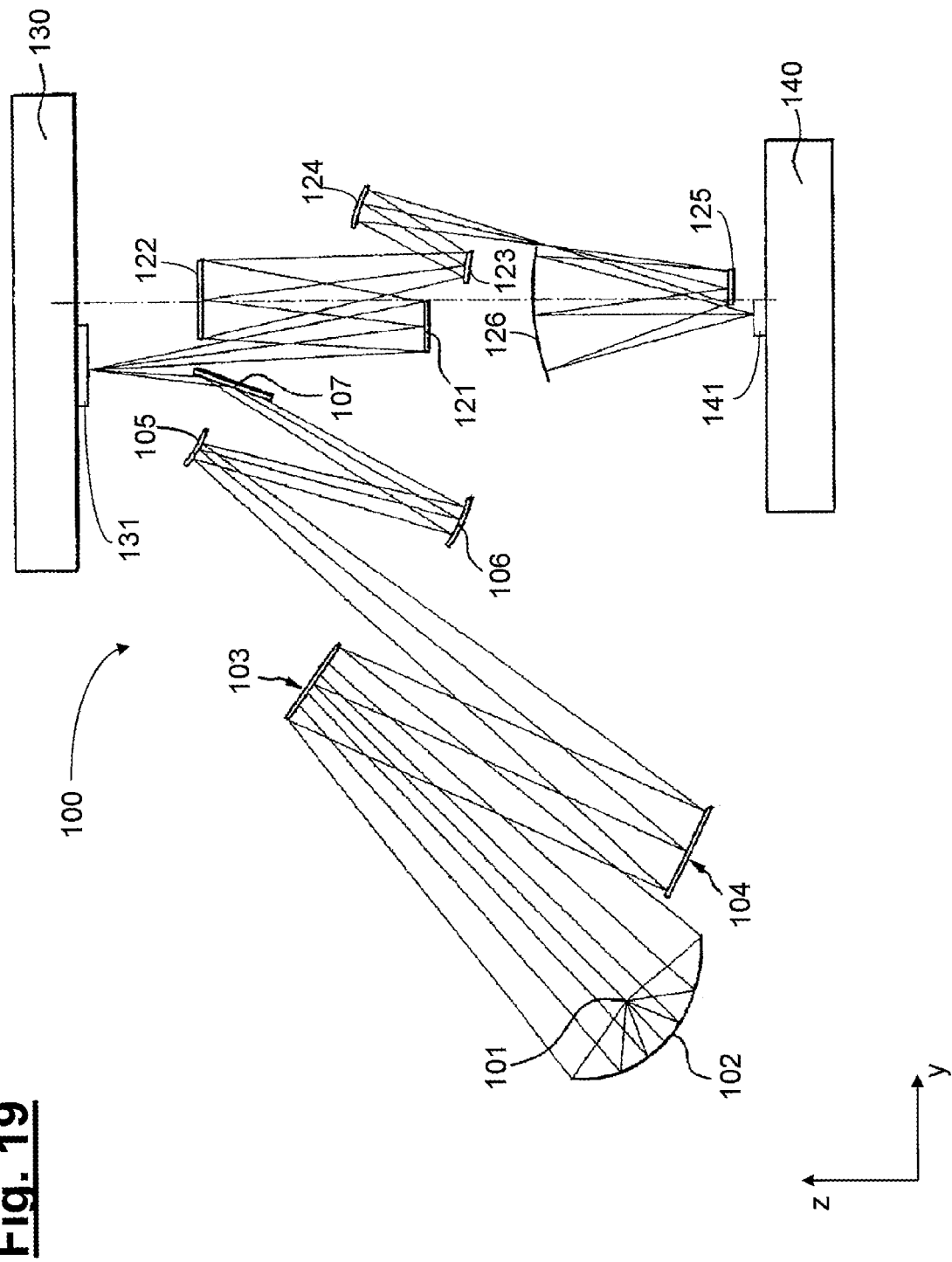
FIGS. 19-20 show schematic illustrations of various embodiments of a microlithographic projection exposure apparatus.
Figure 20:
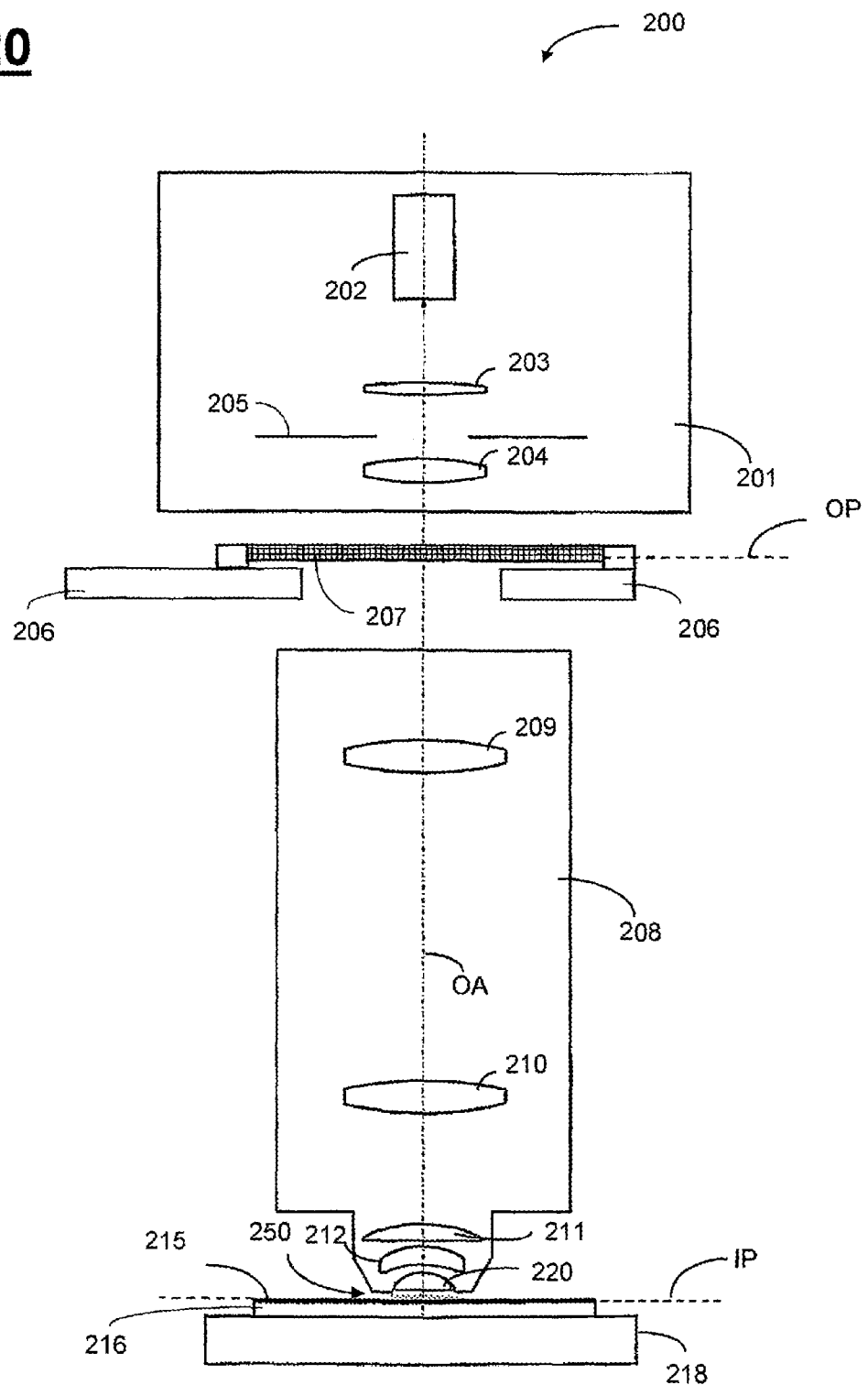

FIGS. 19 and 20 show schematic illustrations of different embodiments of a microlithographic projection exposure apparatus.

FIG. 19 firstly shows a schematic illustration of a projection exposure apparatus 100 which is designed for operation in the EUV and in which the disclosure is able to be realized, for example.

In accordance with FIG. 19, an illumination unit of the projection exposure apparatus 100 includes a field facet mirror 103 and a pupil facet mirror 104. The light from a light source unit, which includes an EUV light source (plasma light source) 101 and a collector mirror 102 in the example, is directed onto the field facet mirror 103. A first telescope mirror 105 and a second telescope mirror 106 are arranged in the light path downstream of the pupil facet mirror 104. Arranged downstream in the light path is a deflection mirror 107, which directs the radiation incident on it onto an object field in the object plane of a projection lens including six mirrors 121-126. A reflective structure-bearing mask 131 on a mask stage 130 is arranged at the location of the object field, the mask being imaged into an image plane with the aid of the projection lens, and in the image plane a substrate 141 coated with a light-sensitive layer (photoresist) is situated on a wafer stage 140.

FIG. 20 shows a schematic illustration of a further possible set-up of a microlithographic projection exposure apparatus 200 which is designed for operation at wavelengths in the DUV range (e.g. approximately 193 nm) and likewise includes an illumination unit 201 and a projection lens 208.

The illumination unit 201 includes a light source 202 and an illumination optical unit symbolized in a greatly simplified manner by lens elements 203, 204 and a stop 205. In the example shown, the operating wavelength of the projection exposure apparatus 200 is 193 nm with the use of an ArF excimer laser as light source 202. However, the operating wavelength can for example also be 248 nm with the use of a KrF excimer laser or 157 nm with the use of an F2 laser as light source 202. Between the illumination unit 201 and the projection lens 208, a mask 207 is arranged in the object plane OP of the projection lens 208, the mask being held in the beam path via a mask holder 206. The mask 207 has a structure in the micrometers to nanometers range, which is imaged onto an image plane IP of the projection lens 208 with its size reduced by a factor of 4 or 5, for example, via the projection lens 208. The projection lens 208 includes a lens element arrangement, which is likewise symbolized merely in a greatly simplified manner by lens elements 209 to 212 and by which an optical axis OA is defined. A substrate 216 positioned by a substrate holder 218 and provided with a light-sensitive layer 215, or a wafer, is held in the image plane IP of the projection lens 208. An immersion medium 250, which can be deionized water, for example, is situated between the last optical element 220 of the projection lens 208 on the image plane side and the light-sensitive layer 215.

Even though the disclosure has been described on the basis of specific embodiments, numerous variations and alternative embodiments are apparent to the person skilled in the art, e.g. through combination and/or exchange of features of individual embodiments. Accordingly, for the person skilled in the art it goes without saying that such variations and alternative embodiments are concomitantly encompassed by the present disclosure, and the scope of the disclosure is restricted only within the meaning of the accompanying patent claims and the equivalents thereof.

What is claimed is:

1. A method, comprising:
    exposing a photoresist by projecting at least one part of a mask onto a region of the photoresist using a projection exposure apparatus which comprises an illumination unit and a projection lens, thereby forming an exposed photoresist comprising structures;
    ascertaining a deviation of at least one structure property of the structures from a predefined desired structure property, wherein ascertaining comprises determining at least one property of a light field used to form the exposed photoresist;
    treating the exposed photoresist on the basis of the ascertained deviation of the at least one structure property, thereby forming a treated photoresist; and
    chemically developing the treated photoresist.

2. The method of claim 1, wherein the at least one structure property comprises a structure size of the structures.

3. The method of claim 1, wherein treating the exposed photoresist comprises altering a concentration of free hydrogen ions present in the photoresist after the exposing.

4. The method of claim 3, wherein altering the concentration of free hydrogen ions comprises post-exposing the photoresist with light having a wavelength deviating from an operating wavelength of the projection exposure apparatus.

5. The method of claim 4, comprising post-exposing the photoresist without using a mask.

6. The method of claim 3, wherein altering the concentration of free hydrogen ions comprises applying an acid or an acid scavenger to the photoresist.

7. The method of claim 6, wherein altering the concentration of free hydrogen ions comprises post-exposing the photoresist with light having a wavelength deviating from an operating wavelength of the projection exposure apparatus.

8. The method of claim 7, comprising post-exposing the photoresist without using a mask.

9. The method of claim 1, wherein treating the exposed photoresist comprises using a spatial resolution that is coarser than ten times an average structure size of the structures.

10. The method of claim 1, further comprising, while chemically developing the treated photoresist, modifying a temperature depending on the ascertained deviation.

11. The method of claim 1, wherein ascertaining the deviation of the at least one structure property comprises ascertaining at least one member selected from the group consisting of:
    a location-dependent measurement of the intensity distribution generated during illumination of the mask by the illumination unit;
    a location-dependent measurement of transmission properties of the projection lens;
    a pupil-dependent measurement of transmission properties of the projection lens;
    a polarization-dependent measurement of transmission properties of the projection lens;
    a measurement of the properties of the light source; and
    the measurement of the illumination of at least one pupil plane in the projection exposure apparatus.

12. The method of claim 1, wherein ascertaining the deviation of at least one structure property comprises calculating or modelling at least one member selected from the group consisting of:
    an intensity distribution generated by the illumination unit at the location of the mask;
    location-dependent transmission properties of the projection lens;
    pupil-dependent transmission properties the projection lens;
    polarization-dependent transmission properties of the projection lens;
    a wavefront of the projection lens; and
    an illumination of at least one pupil plane in the projection exposure apparatus.

13. The method of claim 1, wherein the at least one structure property comprises a structure position of the structures.

14. The method of claim 1, wherein iii) comprises an etching process.

15. The method of claim 1, wherein treating the exposed photoresist comprises heating the photoresist and moving the structures by local movement of the photoresist.

16. The method of claim 1, wherein:
    the at least one structure property comprises a structure size of the structures;
    treating the exposed photoresist comprises altering a concentration of free hydrogen ions present in the photo-resist after the exposing; and
    altering the concentration of free hydrogen ions comprises post-exposing the photoresist with light having a wavelength deviating from an operating wavelength of the projection exposure apparatus.

17. The method of claim 16, wherein altering the concentration of free hydrogen ions comprises post-exposing the photoresist with light having a wavelength deviating from an operating wavelength of the projection exposure apparatus.

18. The method of claim 16, wherein altering the concentration of free hydrogen ions comprises applying an acid or an acid scavenger to the photoresist.

19. A method of processing a photoresist, the method comprising:
   projecting at least one part of a mask onto a region of the photoresist using a projection exposure apparatus which comprises an illumination unit and a projection lens, thereby exposing the photoresist to form an exposed photoresist with structures;
   determining a property of a light field used for exposing the photoresist;
   using the determined property of the light field to ascertain a deviation of a structure property of the structures of the exposed photoresist from a predefined desired structure property; and
   treating the exposed photoresist on the basis of the ascertained deviation of the property.

20. The method of claim 19, further comprising, after treating the exposed photoresist, chemically developing the photoresist.

* * * * *

UNITED STATES PATENT AND TRADEMARK OFFICE
CERTIFICATE OF CORRECTION

PATENT NO. : 10,802,403 B2
APPLICATION NO. : 16/385807
DATED : October 13, 2020
INVENTOR(S) : Michael Patra Page 1 of 1

It is certified that error appears in the above-identified patent and that said Letters Patent is hereby corrected as shown below:

In the Specification

Column 1, Lines 11-12, delete "10 2016 203 591.6," and insert -- 10 2016 221 261.3, --.

Signed and Sealed this
Twenty-ninth Day of December, 2020

Andrei Iancu
*Director of the United States Patent and Trademark Office*